US012701867B2

(12) United States Patent
Park et al.

(10) Patent No.: US 12,701,867 B2
(45) Date of Patent: Aug. 4, 2026

(54) DISPLAY DEVICE HAVING PARTIAL OVERLAP BETWEEN OPENING OF PIXEL DEFINING LAYER AND VIA HOLE

(71) Applicant: Samsung Display Co., LTD., Yongin-si (KR)

(72) Inventors: Do Yeong Park, Yongin-si (KR); Ki Hyun Pyo, Yongin-si (KR); Kyung Bae Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 530 days.

(21) Appl. No.: 18/347,993

(22) Filed: Jul. 6, 2023

(65) Prior Publication Data

US 2024/0023378 A1 Jan. 18, 2024

(30) Foreign Application Priority Data

Jul. 12, 2022 (KR) ........................ 10-2022-0085851

(51) Int. Cl.
H10K 59/122 (2023.01)
G09G 3/3233 (2016.01)
(Continued)

(52) U.S. Cl.
CPC ......... H10K 59/122 (2023.02); G09G 3/3233 (2013.01); H10K 59/131 (2023.02);
(Continued)

(58) Field of Classification Search
CPC ............. H01L 27/3293; H01L 51/0097; H01L 2251/5338; H01L 27/3276; H01L 27/156; H01L 27/1214; H01L 25/18; H01L 23/60; H01L 27/0248; Y02E 10/549; G09G 2300/026; G09G 2380/02; G09G 3/32;
(Continued)

(56) References Cited

U.S. PATENT DOCUMENTS 9,792,867 B2 * 10/2017 Ohishi .................. G02F 1/1345
10,332,945 B2 6/2019 Kim
(Continued)

FOREIGN PATENT DOCUMENTS

KR 1020180066948 A 6/2018
KR 10-2020-0011302 2/2020
(Continued)

*Primary Examiner* — Caleb E Henry
(74) *Attorney, Agent, or Firm* — CANTOR COLBURN LLP

(57) ABSTRACT

A display device includes pixels each including an emission area and a non-emission area. Each pixel includes: a driving voltage line; a via layer disposed on the driving voltage line and including a first via hole exposing a first side of the driving voltage line, and a second via hole; a first electrode disposed on the via layer; a pixel defining layer disposed on the first electrode and the via layer and including a first opening formed in the emission area to expose a portion of the first electrode, and a second opening disposed in the non-emission area; an emission layer disposed in the first opening; and a second electrode disposed on the emission layer and the pixel defining layer. The second opening and the first via hole partially overlap each other. The via layer covers a second side of the driving voltage line.

21 Claims, 11 Drawing Sheets

(51) Int. Cl.

| | |
|---|---|
| *H10K 59/131* | (2023.01) |
| *H10K 59/38* | (2023.01) |
| *H10K 59/80* | (2023.01) |

(52) U.S. Cl.
CPC ........... *H10K 59/38* (2023.02); *H10K 59/873* (2023.02); *H10K 59/8792* (2023.02); *G09G 2300/0842* (2013.01)

(58) Field of Classification Search
CPC ......... G09G 2300/0426; G09G 3/3208; G09G 3/3233; G09G 2300/0842; G09G 2300/0819; G09G 2300/0866; G06F 3/147; G06F 3/1446; G06F 3/0412; G06F 3/04164; G06F 3/0443; G06F 2203/04107; G06F 2203/04111; G06F 2203/04103; G06F 3/041; H10K 59/18; H10K 77/111; H10K 2102/311; H10K 59/131; H10K 59/40; H10K 59/1213; H10K 59/122; H10K 59/38; H10K 59/873; H10K 59/8792; H10K 59/80522; H10K 59/12; H10K 50/15; H10K 50/16; H10K 50/81; H10K 50/82; H10K 59/124; H10K 59/35; H10K 59/8051; G09F 9/301; G09F 9/33
See application file for complete search history.

(56) References Cited

U.S. PATENT DOCUMENTS

| | | | | |
|---|---|---|---|---|
| 10,361,223 | B2 * | 7/2019 | Kim ...................... | H10K 59/131 |
| 10,503,297 | B2 * | 12/2019 | Zeng ................... | H04M 1/0266 |
| 10,575,403 | B2 * | 2/2020 | Park ..................... | G02F 1/1333 |
| 11,011,673 | B2 | 5/2021 | Park et al. | |
| 11,411,197 | B2 | 8/2022 | Moon et al. | |
| 11,538,409 | B2 * | 12/2022 | Lee ...................... | G09G 3/3233 |
| 11,758,796 | B2 | 9/2023 | Katsushi | |
| 2007/0291042 | A1 * | 12/2007 | Kwak ................... | G09G 3/3688 |
| | | | | 345/535 |
| 2007/0296659 | A1 * | 12/2007 | Kwak ................. | G02F 1/13452 |
| | | | | 349/56 |

| | | | | |
|---|---|---|---|---|
| 2013/0228867 | A1 * | 9/2013 | Suematsu ............... | H01L 23/60 |
| | | | | 257/355 |
| 2014/0117998 | A1 * | 5/2014 | Hwang ................. | G09G 3/006 |
| | | | | 324/511 |
| 2014/0217373 | A1 * | 8/2014 | Youn ................... | H01L 23/4985 |
| | | | | 438/23 |
| 2014/0376135 | A1 * | 12/2014 | Huo ..................... | H10D 89/711 |
| | | | | 361/56 |
| 2015/0036300 | A1 * | 2/2015 | Park ...................... | H05K 1/147 |
| | | | | 156/212 |
| 2015/0103500 | A1 * | 4/2015 | Bae ........................ | H05K 1/111 |
| | | | | 228/102 |
| 2015/0270287 | A1 * | 9/2015 | Kim .................... | H10D 86/441 |
| | | | | 257/40 |
| 2016/0172428 | A1 * | 6/2016 | Song ................... | H10K 59/131 |
| | | | | 257/40 |
| 2017/0069616 | A1 * | 3/2017 | Cai ...................... | H10D 84/135 |
| 2017/0179112 | A1 * | 6/2017 | Narita ................ | H01L 23/5221 |
| 2018/0301520 | A1 * | 10/2018 | Jin ...................... | H10K 59/1315 |
| 2018/0342570 | A1 * | 11/2018 | Hong ................... | H10K 59/352 |
| 2019/0179591 | A1 * | 6/2019 | Kuo ..................... | G06F 3/1446 |
| 2019/0281699 | A1 * | 9/2019 | Bae ........................ | H05K 1/111 |
| 2019/0296099 | A1 * | 9/2019 | Lee .................... | H10K 59/131 |
| 2019/0346953 | A1 * | 11/2019 | Peng ...................... | G09G 3/20 |
| 2020/0035165 | A1 * | 1/2020 | Park .................... | G09G 3/3233 |
| 2020/0312236 | A1 * | 10/2020 | Ma ...................... | G09G 3/3225 |
| 2020/0320959 | A1 * | 10/2020 | Ryu ...................... | G09G 3/20 |
| 2021/0175460 | A1 * | 6/2021 | Baek ................. | H10K 59/1315 |
| 2021/0202667 | A1 * | 7/2021 | Kim ................. | H10K 59/80522 |
| 2021/0359048 | A1 | 11/2021 | Kim et al. | |
| 2021/0376019 | A1 | 12/2021 | Kim | |
| 2022/0036810 | A1 * | 2/2022 | Gu ...................... | H10K 59/353 |
| 2022/0102471 | A1 * | 3/2022 | Jang ................... | H10K 59/131 |
| 2022/0123060 | A1 | 4/2022 | Kang et al. | |
| 2022/0384548 | A1 * | 12/2022 | Keum ................. | G09G 3/3233 |

FOREIGN PATENT DOCUMENTS

| | | |
|---|---|---|
| KR | 10-2021-0071368 | 6/2021 |
| KR | 10-2021-0083989 | 7/2021 |
| KR | 1020210083702 A | 7/2021 |
| KR | 1020210097248 A | 8/2021 |
| KR | 1020220030361 A | 3/2022 |
| KR | 10-2022-0050282 | 4/2022 |

* cited by examiner

FIG. 9

DISPLAY DEVICE HAVING PARTIAL OVERLAP BETWEEN OPENING OF PIXEL DEFINING LAYER AND VIA HOLE

CROSS-REFERENCE TO RELATED APPLICATION(S)

This application claims priority to and benefits of Korean patent application number 10-2022-0085851 under 35 U.S.C. § 119, filed on Jul. 12, 2022, the entire contents of which are incorporated herein by reference.

BACKGROUND

1. Technical Field

Various embodiments relate to a display device.

2. Description of Related Art

Recently, as interest in information display increases, research and development on display devices have been continuously conducted.

SUMMARY

Embodiments provide a display device capable of improving reliability.

However, embodiments of the disclosure are not limited to those set forth herein. The above and other embodiments will become more apparent to one of ordinary skill in the art to which the disclosure pertains by referencing the detailed description of the disclosure given below.

An embodiment may provide a display device including a plurality of pixels including an emission area and a non-emission area. Each pixel may include: a driving voltage line disposed on a substrate; a via layer disposed on the driving voltage line and including a first via hole exposing a first side of the driving voltage line, and a second via hole spaced apart from the first via hole; a first electrode disposed on the via layer; a pixel defining layer disposed on the first electrode and the via layer and including a first opening disposed in the emission area and exposing a portion of the first electrode, and a second opening spaced apart from the first opening and disposed in the non-emission area; an emission layer disposed in the first opening of the pixel defining layer; and a second electrode disposed on the emission layer and the pixel defining layer. The second opening of the pixel defining layer and the first via hole of the via layer may partially overlap each other in the non-emission area. The via layer may cover a second side of the driving voltage line.

In an embodiment, a first central point that divides the first via hole of the via layer into two portions may be spaced apart from a second central point that divides the second opening of the pixel defining layer into two portions, in a direction.

In an embodiment, the first opening of the pixel defining layer, the first via hole of the via layer, and the second opening of the pixel defining layer may be disposed in the direction. The pixel defining layer may include a first edge and a second edge that face each other in the direction and define the first opening between the first edge and the second edge, and a third edge and a fourth edge that face each other in the direction and define the second opening between a third edge and a fourth edge. The via layer may include a fifth edge and a sixth edge that face each other in the direction and define the first via hole between the fifth edge and the sixth edge.

In an embodiment, the first edge of the pixel defining layer, the second edge of the pixel defining layer, the third edge of the pixel defining layer, the fourth edge of the pixel defining layer, the fifth edge of the via layer, and the sixth edge of the via layer may be spaced apart from each other.

In an embodiment, the first edge of the pixel defining layer, the second edge of the pixel defining layer, the fifth edge of the via layer, the third edge of the pixel defining layer, the sixth edge of the via layer, and the fourth edge of the pixel defining layer may be sequentially disposed in the direction in a plan view.

In an embodiment, the fifth edge of the via layer and the third edge of the pixel defining layer may be spaced apart from each other by a first distance in the direction. The sixth edge of the via layer and the fourth edge of the pixel defining layer may be spaced apart from each other by a second distance in the direction. The first distance and the second distance may be substantially identical to each other.

In an embodiment, the second edge of the pixel defining layer and the fifth edge of the via layer may be spaced apart from each other by a third distance in the direction. The third distance may be substantially identical to each of the first distance and the second distance.

In an embodiment, the third edge of the pixel defining layer and the sixth edge of the via layer may be spaced apart from each other by a fourth distance in the direction in a plan view. The fourth distance may be different from each of the first distance, the second distance, and the third distance.

In an embodiment, each pixels may further include a conductive pattern layer disposed in the first via hole of the via layer and the second opening of the pixel defining layer in the non-emission area, and the conductive pattern layer may be disposed on the first side of the driving voltage line and may contact the driving voltage line.

In an embodiment, the conductive pattern layer and the first electrode may include a same material.

In an embodiment, the second electrode may contact the conductive pattern layer in an overlap area where the first via hole of the via layer and the second opening of the pixel defining layer overlap each other, and the second electrode may be electrically connected to the driving voltage line through the conductive pattern layer.

In an embodiment, the emission layer may include: a first layer disposed on the first electrode in the first opening of the pixel defining layer; a second layer disposed on the first layer; and a third layer disposed between the second layer and the second electrode. The first layer, the second layer, and the third layer may be disposed in the first opening.

In an embodiment, each of the first layer, the second layer, and the third layer may be formed in the first opening by an inkjet printing operation.

In an embodiment, the first electrode may be an anode. The first layer may include a hole transport layer. The second layer may include a light generation layer. The third layer may include an electron transport layer. The second electrode may be a cathode.

In an embodiment, the first electrode may be a cathode. The first layer may include an electron transport layer. The second layer may include a light generation layer. The third layer may include a hole transport layer. The second electrode may be an anode.

In an embodiment, each pixel may further include a thin-film encapsulation layer disposed on the second electrode. The thin-film encapsulation layer may include a first encapsulation layer disposed on the second electrode, a second encapsulation layer disposed on the first encapsulation layer, and a third encapsulation layer disposed on the second encapsulation layer. Each of the first encapsulation layer and the third encapsulation layers may include an inorganic layer, and the second encapsulation layer may include an organic layer.

In an embodiment, each pixel may further include a color filter layer disposed on the thin-film encapsulation layer. The color filter layer may include: a color filter disposed over the emission layer; and a light blocking pattern layer disposed adjacent to the color filter and disposed in the non-emission area.

In an embodiment, the first via hole of the via layer and the second opening of the pixel defining layer may extend to the non-emission areas of adjacent pixels.

In an embodiment, each pixel may further include a conductive pattern layer disposed in the first via hole of the via layer and the second opening of the pixel defining layer, the conductive pattern layer may be disposed on the first side of the driving voltage line and contacts the driving voltage line. The conductive pattern layer may extend to the non-emission areas of the adjacent pixels.

An embodiment may provide a display device including: a substrate including an emission area and a non-emission area; a driving voltage line disposed in the non-emission area; a via layer disposed on the driving voltage line and including a first via hole exposing a first side of the driving voltage line, and a second via hole spaced apart from the first via hole; a first-first electrode, a first-second electrode, and a first-third electrode disposed on the via layer in the emission area, and spaced apart from each other; a pixel defining layer disposed on the first-first electrode, the first-second electrode, and the first-third electrode and the via layer, and including a first opening disposed in the emission area and exposing a portion of each of the first-first electrode, the first-second electrode, and the first-third electrode, and a second opening spaced apart from the first opening and disposed in the non-emission area; a first emission layer disposed on the first-first electrode, a second emission layer disposed on the first-second electrode, and a third emission layer disposed on the first-third electrode; and a second electrode disposed on the first emission layer, the second emission layer, and the third emission layer and the pixel defining layer. The first emission layer, the second emission layer, and the third emission layer may emit different colors of light. The second opening of the pixel defining layer and the first via hole of the via layer may partially overlap each other in the non-emission area. The via layer may cover a second side of the driving voltage line.

In an embodiment, a first central point that divides the first via hole into two portions may be spaced apart from a second central point that divides the second opening into two portions, in a direction.

BRIEF DESCRIPTION OF THE DRAWINGS

FIG. 9 is a schematic cross-sectional view taken along line II-IF of FIG. 5.

DETAILED DESCRIPTION OF THE EMBODIMENTS

Figure 1:
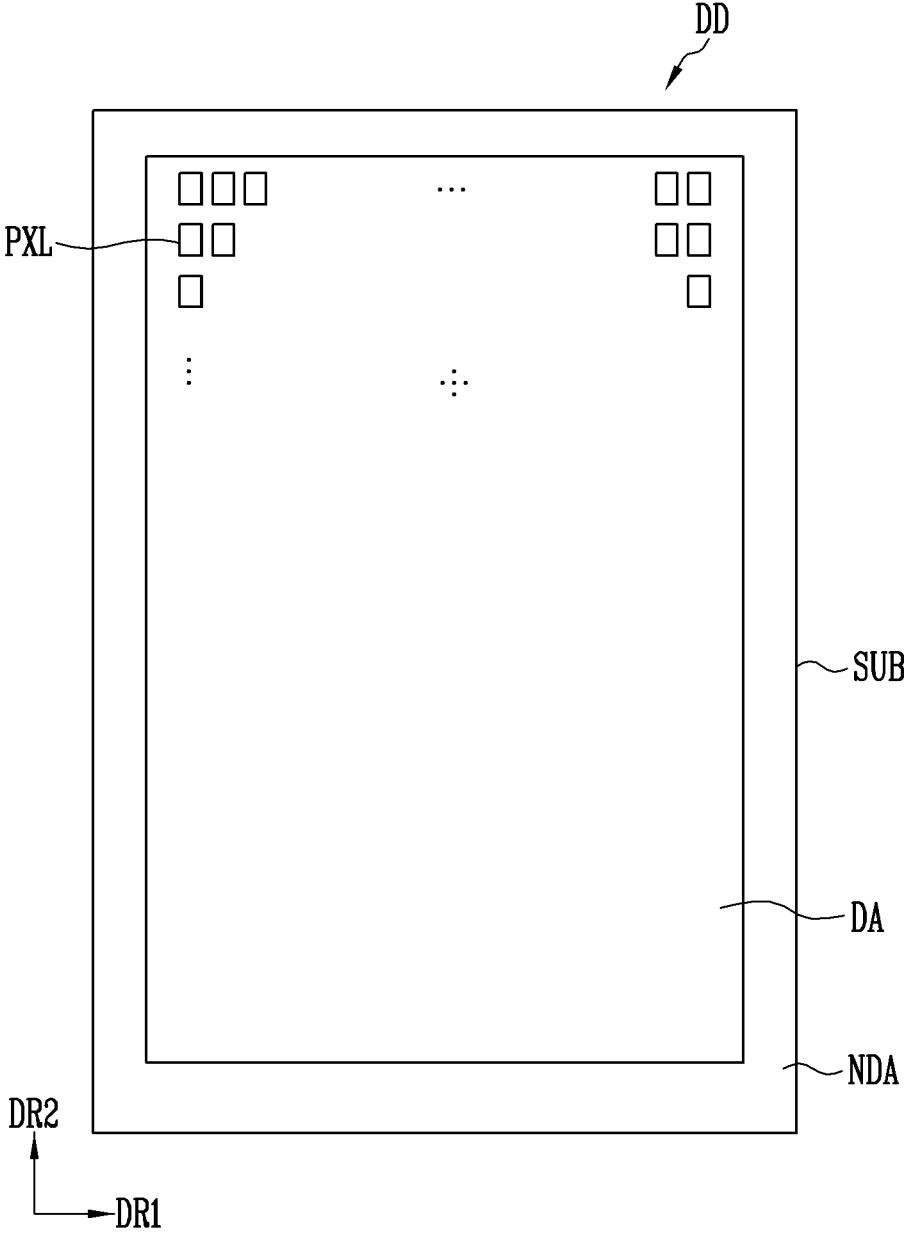
FIG. 1 is a schematic plan view illustrating a display device in accordance with an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

FIG. 1 is a schematic plan view illustrating the display device DD in accordance with an embodiment.

For convenience of description, FIG. 1 schematically illustrates the structure of the display device DD including a display area DA in which an image is displayed.

For example, the display device DD may be an electronic device having a display surface on at least one surface thereof, e.g., a smartphone, a television, a tablet PC, a mobile phone, a video phone, an electronic reader, a desktop PC, a laptop PC, a netbook computer, a workstation, a server, a personal digital assistant (PDA), a portable multimedia player (PMP), an MP3 player, a medical appliance, a camera, or a wearable device. Embodiments may be applied to the display device DD.

Referring to FIG. 1, the display device DD in accordance with an embodiment may include a substrate SUB, pixels PXL disposed on the substrate SUB, a driver which is formed on the substrate SUB and drives the pixels PXL, and a line component which electrically connects the pixels PXL with the driver.

The substrate SUB may include transparent insulating material transmitting light. The substrate SUB may be a rigid substrate or a flexible substrate.

For example, the rigid substrate SUB may include a glass substrate, a quartz substrate, a glass ceramic substrate, and a crystalline glass substrate.

The flexible substrate SUB may be either a film substrate or a plastic substrate including polymer organic material. For example, the flexible substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

An area of the substrate SUB may be the display area DA in which the pixels PXL are disposed, and the other area of the substrate SUB may be the non-display area NDA. For example, the substrate SUB may include a display area DA including pixel areas in which the respective pixels PXL are disposed, and a non-display area NDA disposed around the perimeter of the display area DA (or adjacent to the display area DA).

The display area DA may have various shapes. For example, the display area DA may be formed in various forms such as a closed polygon including sides formed of linear lines, a circle, an ellipse or the like including a side formed of a curved line, and a semicircle, a semiellipse or the like including sides formed of a linear line and a curved line.

The non-display area NDA may be disposed at at least one side of the display area DA. For example, the non-display area NDA may enclose (or surround) the perimeter of the display area DA.

The pixels PXL may be formed in the display area DA on the substrate SUB, and be connected (e.g., electrically connected) to the line component. Each of the pixels PXL refers to a smallest unit for displaying an image, and pixels PXL may be formed.

Each of the pixels PXL may include a light emitting element which emits white light and/or color light, and a pixel circuit that drives the light emitting element. The pixel circuit may include at least one transistor which is connected (e.g., electrically connected) to the light emitting element. Each pixel PXL may emit light having any one color among red, green, and blue, and embodiments are not limited thereto. Each pixel PXL may emit light having any one color among cyan, magenta, yellow, and white.

The pixels PXL may be arranged in a matrix form along rows extending in a first direction DR1 and columns extending in a second direction DR2 intersecting with the first direction DR1. However, the arrangement of the pixels PXL is not limited thereto. For example, the pixels PXL may be arranged in various forms.

The driver may provide a signal to each pixel PXL through the line component and thus control the operation of the pixel PXL.

The driver may successively (or sequentially) scan the pixels PXL of the display area DA and supply data signals corresponding to image data to the pixels PXL. For example, the display device DD may display an image corresponding to the image data.

Figure 2:
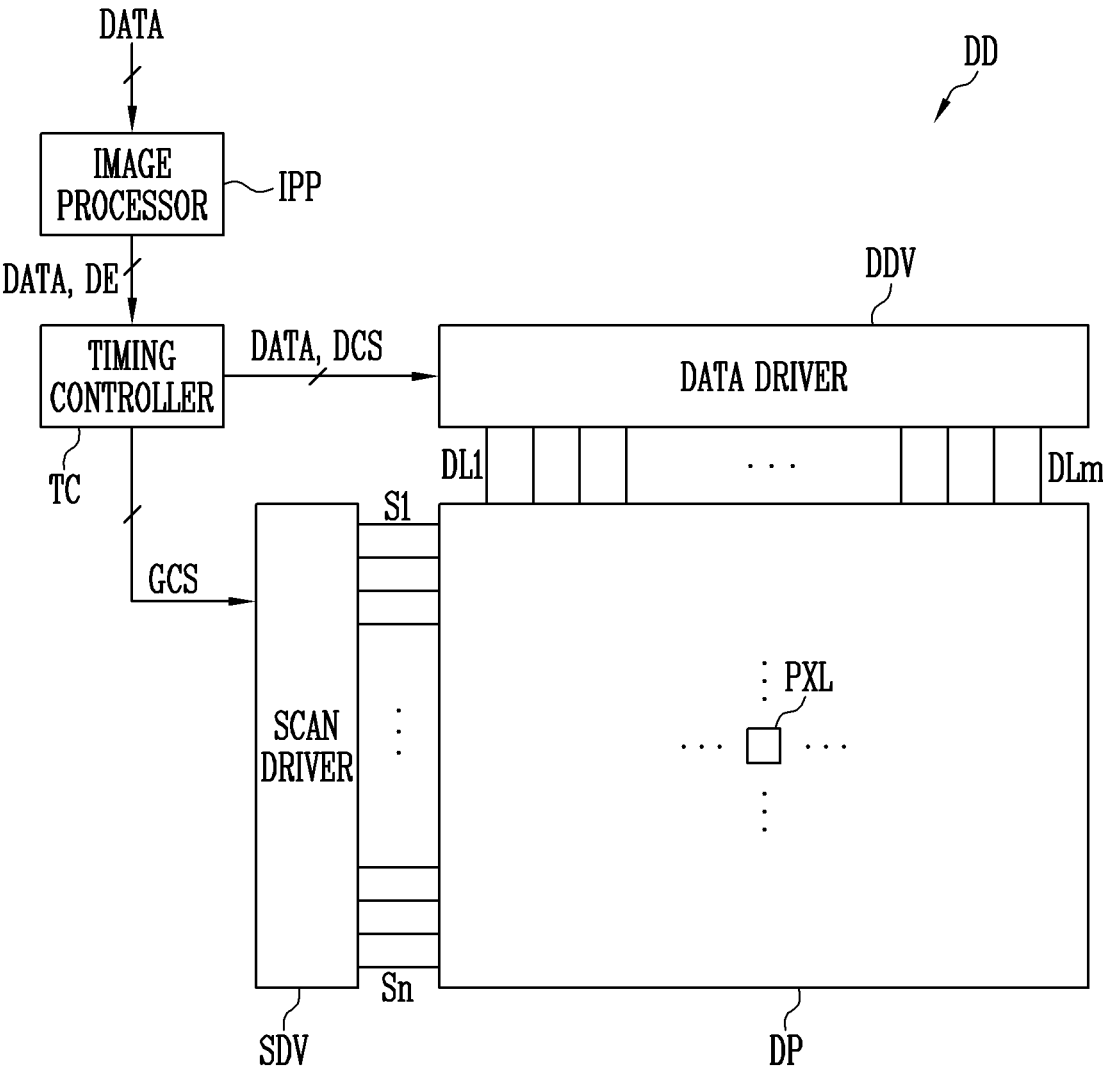
FIG. 2 is a block diagram illustrating pixels and a driver in the display device of FIG. 1 in accordance with an embodiment.

FIG. 2 is a schematic block diagram illustrating pixels PXL and a driver in the display device DD of FIG. 1 in accordance with an embodiment.

Referring to FIGS. 1 and 2, the display device DD in accordance with an embodiment may include a display panel DP, a driver, and a line component.

The display panel DP may display an image in response to a data signal DATA and a scan signal that are supplied from the data driver DDV and the scan driver SDV. The display panel DP may include pixels PXL which display an image.

The driver may include an image processor IPP, a timing controller TC, a data driver DDV, and a scan driver SDV.

The image processor IPP may output a data enable signal DE or the like along with the data signal DATA supplied from an external device. The image processor IPP may output one or more of a vertical synchronization signal, a horizontal synchronization signal, a clock signal, and the data enable signal DE.

The timing controller TC may receive the data signal DATA, and a data enable signal DE or a driving signal including a vertical synchronization signal, a horizontal synchronization signal, and a clock signal. The timing controller TC may output a gate control signal GCS and a data control signal DCS. For example, a gate control signal GCS may be supplied to the scan driver SDV to control an operation timing of the scan driver SDV, and a data control signal DCS may be supplied to the data driver DDV to control an operation timing of the data driver DDV.

In response to the data control signal DCS supplied from the timing controller TC, the data driver DDV may convert the data signal DATA to be supplied to the timing controller TC to a corresponding data voltage and output the converted data voltage. The data driver DDV may supply data voltages to the data lines DL1 to DLm. The data voltages supplied to the data lines DL1 to DLm may be supplied to pixels PXL that are selected by a scan signal.

The scan driver SDV may apply scan signals to the scan lines S1 to Sn in response to the gate control signal GCS supplied from the timing controller TC. For example, in case that the scan signals are sequentially supplied from the scan driver SDV to the scan lines S1 to Sn, the pixels PXL may be sequentially selected in a horizontal line basis.

Figure 3:
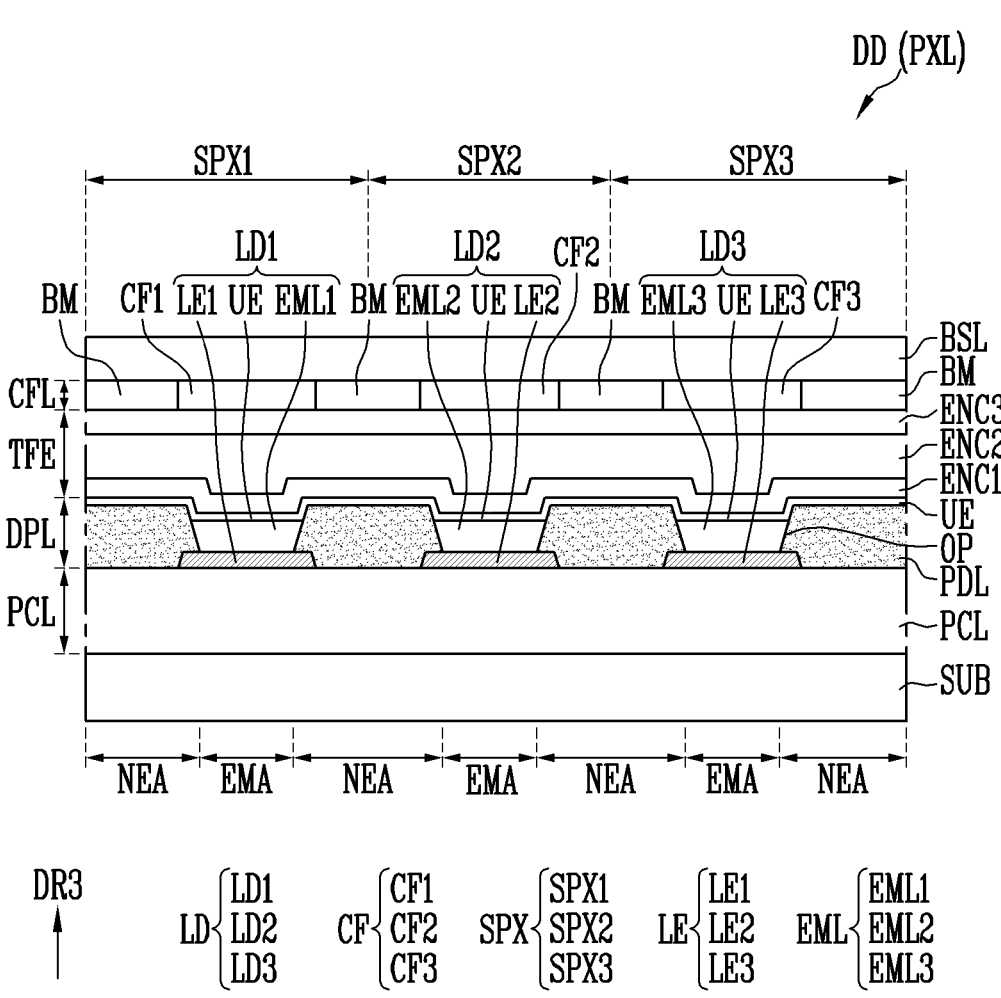
FIG. 3 is a schematic cross-sectional view illustrating a display device in accordance with an embodiment.

FIG. 3 is a schematic cross-sectional view illustrating the display device DD in accordance with an embodiment.

For the convenience of description, in FIG. 3, there is simply illustrated the structure of the display device DD including the pixel PXL formed on the substrate SUB, and a thickness direction of the substrate SUB is indicated by a third direction DR3.

Referring to FIGS. 1 to 3, the display device DD may include at least one pixel PXL formed on the substrate SUB.

The pixel PXL may be disposed in a pixel area included in the display area DA. In an embodiment, the display area DA may include an emission area EMA, and a non-emission area NEA adjacent to the emission area EMA.

The pixel PXL may include sub-pixels SPX. For example, the pixel PXL may include a first sub-pixel SPX1, a second sub-pixel SPX2, and a third sub-pixel SPX3. In the following embodiment, the term "sub-pixel SPX" or "sub-pixels SPX" will be used to collectively designate the first sub-pixel SPX1, the second sub-pixel SPX2, and the third sub-pixel SPX3.

Each of the first, second, and third sub-pixels SPX1, SPX2, and SPX3 may include a pixel circuit layer PCL, a display element layer DPL, and a thin-film encapsulation layer TFE which are successively (or sequentially) disposed on the substrate SUB.

The pixel circuit layer PCL may include a pixel circuit disposed on the substrate SUB, and signal lines that are connected (e.g., electrically connected) to the pixel circuit. Furthermore, the pixel circuit layer PCL may include at least one or more insulating layers disposed between the components included in the pixel circuit.

The display element layer DPL may be disposed on the pixel circuit layer PCL. The display element layer DPL may include a light emitting element LD that emits light. The light emitting element LD may include a first electrode LE (or a lower electrode), an emission layer EML, and a second electrode UE (or an upper electrode). The first electrode LE may be an anode, and the second electrode UE may be a cathode. However, embodiments are limited thereto. In an embodiment, the first electrode LE may be a cathode, and the second electrode UE may be an anode. The second electrode UE may be a common layer formed in common to adjacent pixels PXL.

In an embodiment, the first electrode LE may include a first-first electrode LE1, a first-second electrode LE2, and a first-third electrode LE3. The first-first electrode LE1 may be disposed in the first sub-pixel SPX1. The first-second electrode LE2 may be disposed in the second sub-pixel SPX2. The first-third electrode LE3 may be disposed in the third sub-pixel SPX3.

The emission layer EML may include a first emission layer EML1 disposed on the first-first electrode LE1, a second emission layer EML2 disposed on the first-second electrode LE2, and a third emission layer EML3 disposed on the first-third electrode LE3. The first emission layer EML1, the second emission layer EML2, and the third emission layer EML3 may emit different colors of light. For example, the first emission layer EML1 may emit red light, the second emission layer EML2 may emit green light, and the third emission layer EML3 may emit blue light. For example, the first sub-pixel SPX1 may be a red pixel (or a red sub-pixel), the second sub-pixel SPX2 may be a green pixel (or a green sub-pixel), and the third sub-pixel SPX3 may be a blue pixel (or a blue sub-pixel). Each of the first, second, and third emission layers EML1, EML2, and EML3 may include a light generation layer emitting light, an electron transport layer, and a hole transport layer.

The first-first electrode LE1, the first emission layer EML1, and the second electrode UE may form a first light emitting element LD1. The first light emitting element LD1 may be disposed in the first sub-pixel SPX1.

The first-second electrode LE2, the second emission layer EML2, and the second electrode UE may form a second light emitting element LD2. The second light emitting element LD2 may be disposed in the second sub-pixel SPX2.

The first-third electrode LE3, the third emission layer EML3, and the second electrode UE may form a third light emitting element LD3. The third light emitting element LD3 may be disposed in the third sub-pixel SPX3.

A pixel defining layer PDL may be disposed on the first electrode LE. The pixel defining layer PDL may include openings OP which respectively expose an area of the first-first electrode LE1, an area of the first-second electrode LE2, and an area of the first-third electrode LE3. The pixel defining layer PDL may be a structure for defining (or partitioning) the respective emission areas EMA of the first, second, and third sub-pixels SPX1, SPX2, and SPX3.

The second electrode UE may be positioned on the first, second, and third emission layers EML1, EML2, and EML3, and the pixel defining layer PDL. The second electrode UE may be a transmission electrode, and include transparent conductive material.

A thin-film encapsulation layer TFE may be positioned on the second electrode UE.

The thin-film encapsulation layer TFE may have a single layer structure, or may have a multi-layer structure. The thin-film encapsulation layer TFE may include insulating layers which cover the first, second, and third light emitting elements LD1, LD2, and LD3. For example, the thin-film encapsulation layer TFE may include at least one inorganic layer and at least one organic layer. For example, the thin-film encapsulation layer TFE may have a structure formed by alternately stacking the inorganic layers and the organic layers. In some embodiments, the thin-film encapsulation layer TFE may be an encapsulation substrate which is disposed on the first, second, and third light emitting elements LD1, LD2, and LD3 and coupled to the substrate SUB by a sealant.

The thin-film encapsulation layer TFE may include first, second, and third encapsulation layers ENC1, ENC2, and ENC3 which are successively (or sequentially) disposed on the second electrode UE. The first encapsulation layer ENC1 may be disposed on the display element layer DPL, and positioned over the display area DA and at least a portion of the non-display area NDA. The second encapsulation layer ENC2 may be disposed on the first encapsulation layer ENC1, and positioned over the display area DA and at least a portion of the non-display area NDA. The third encapsulation layer ENC3 may be disposed on the second encapsulation layer ENC2, and positioned over the display area DA and at least a portion of the non-display area NDA. In an embodiment, the third encapsulation layer ENC3 may be positioned over the display area DA and the entirety of the non-display area NDA.

In an embodiment, the first and third encapsulation layers ENC1 and ENC3 each may be formed of an inorganic layer including inorganic material. The second encapsulation layer ENC2 may be formed of an organic layer including organic material. The inorganic layer may include, for example, silicon nitride ($SiN_x$), silicon oxide ($SiO_x$), or silicon oxynitride ($SiO_xN_y$). The organic layer may include organic insulating material such as polyacrylate resin, epoxy resin, phenolic resin, polyamide resin, polyimide resin, unsaturated polyester resin, polyphenylene resin, polyphenylene sulfide resin, or benzocyclobutene (BCB) resin.

A color filter layer CFL may be selectively disposed over the thin-film encapsulation layer TFE of the pixel PXL. The color filter layer CFL may include a color filter CF and a light blocking pattern layer BM.

The light blocking pattern layer BM may be disposed on a surface of the thin-film encapsulation layer TFE at a position corresponding to the pixel defining layer PDL. The light blocking pattern layer BM may include light blocking material. For example, the light blocking pattern layer BM may include a black matrix. In an embodiment, the light blocking pattern layer BM may include at least one light blocking material and/or reflective material, and may guide light emitted from the emission layer EML to more reliably travel in the image display direction of the display device DD, thus enhancing the light output efficiency.

The color filter CF may be disposed over the corresponding emission layer EML in the emission area EMA enclosed (or surrounded) by the pixel defining layer PDL. The color filter CF may include a first color filter CF1 positioned over the first emission layer EML1, a second color filter CF2 positioned over the second emission layer EML2, and a third color filter CF3 positioned over the third emission layer EML3.

Each of the first, second, and third color filters CF1, CF2, and CF3 may include colorants such as dye or pigment, which may absorb wavelengths other than a corresponding color wavelength. The first color filter CF1 may be a red color filter. The second color filter CF2 may be a green color filter. The third color filter CF3 may be a blue color filter. Although in the drawing there is illustrated the case where the color filters CF that are adjacent to each other are spaced apart from each other with the light blocking pattern layer BM interposed therebetween, the adjacent color filters CF may at least partially overlap each other on the light blocking pattern layer BM.

The base layer BSL may be disposed on the color filter layer CFL. The base layer BSL may prevent the color filter layer CFL from being damaged or contaminated by permeation of external impurities such as water or air. Furthermore, the base layer BSL may prevent colorants of the color filter layer CFL from being diffused (or permeating) into other components. The base layer BSL may be an inorganic layer including inorganic material.

Figure 4:
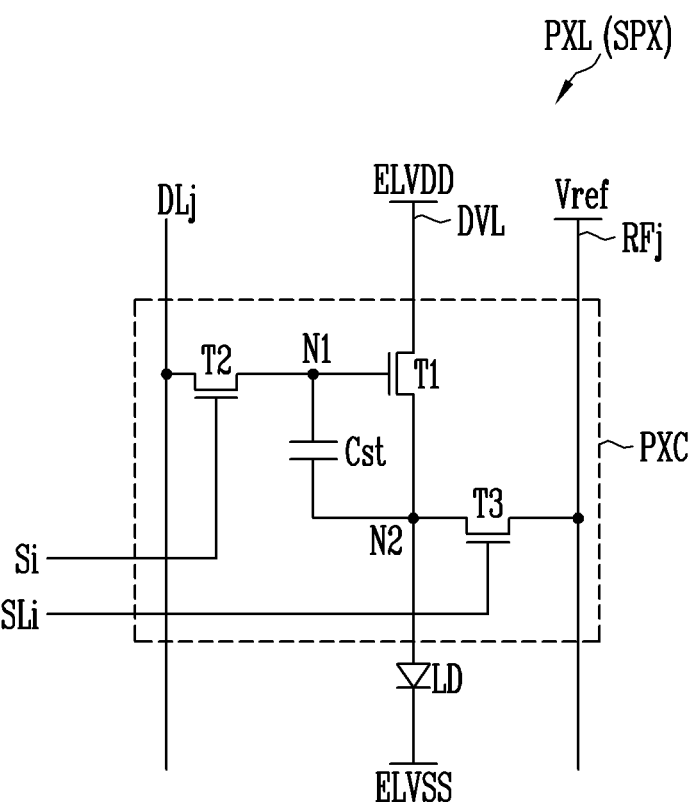
FIG. 4 is a schematic diagram of an equivalent circuit of the pixels illustrated in FIG. 2.

FIG. 4 is a schematic diagram of an equivalent circuit of components included in each of the pixels PXL illustrated in FIG. 2.

For example, FIG. 4 illustrates the electrical connection relationship of components included in the pixel PXL that is formed in an active matrix type display device in accordance with an embodiment. However, the connection relationship of the components of each pixel PXL is not limited thereto.

Referring to FIGS. 1 to 4, the pixel PXL (or the sub-pixel SPX) may include a light emitting element LD, and a pixel circuit PXC which is connected (e.g., electrically connected) to the light emitting element LD and drives the light emitting element LD.

A first electrode of the light emitting element LD may be connected (e.g., electrically connected) to the pixel circuit PXC. The light emitting element LD may generate light (or rays) having a certain luminance corresponding to current supplied from the pixel circuit PXC. For example, a second driving power supply ELVSS may be set to a voltage less than that of a first driving power supply ELVDD during a driving period of the display device DD, embodiments are not limited thereto.

In the case in which the pixel PXL (or the sub-pixel SPX) is disposed on an i-th row and a j-th column in the display area DA, the pixel circuit PXC of the pixel PXL (or the sub-pixel SPX) may be connected (e.g., electrically connected) to an i-th scan line S1 and a j-th data line DLj. Furthermore, the pixel circuit PXC may be connected (e.g., electrically connected) to an i-th sensing line SLi and a j-th reference voltage line RFj.

The pixel circuit PXC may control, in response to a data signal (or a data voltage), current flowing from the first driving power supply ELVDD to the second driving power supply ELVSS through the light emitting element LD.

The pixel circuit PXC may include first to third transistors T1, T2, and T3, and a storage capacitor Cst.

The first transistor T1 may be a driving transistor that controls driving current to be applied to the light emitting element LD and be connected (e.g., electrically connected) between the first driving power supply ELVDD and the light emitting element LD. For example, a first terminal of the first transistor T1 may be connected (e.g., electrically connected) to the first driving power supply ELVDD by a driving voltage line DVL. A second terminal of the first transistor T1 may be connected (e.g., electrically connected) to a second node N2. A gate electrode of the first transistor T1 may be connected (e.g., electrically connected) to a first node N1. The first transistor T1 may control, in response to a voltage applied to the first node N1, driving current to be applied from the first driving power supply ELVDD to the light emitting element LD through the second node N2. In an embodiment, the first terminal of the first transistor T1 may be a drain electrode, and the second terminal of the first transistor T1 may be a source electrode, and embodiments are not limited thereto. In an embodiment, the first terminal may be a source electrode, and the second terminal may be a drain electrode.

The second transistor T2 may be a switching transistor which selects a pixel PXL in response to a scan signal and activates the pixel PXL, and may be connected (e.g., electrically connected) between the j-th data line DLj and the first node N1. A first terminal of the second transistor T2 may be connected (e.g., electrically connected) to the j-th data line DLj. A second terminal of the second transistor T2 may be connected (e.g., electrically connected) to the first node N1. A gate electrode of the second transistor T2 may be connected (e.g., electrically connected) to the i-th scan line S1. The first terminal and the second terminal of the second transistor T2 are different terminals, and, for example, in case that the first terminal is a drain electrode, and the second terminal may be a source electrode.

In case that a scan signal having a gate-on voltage (e.g., a high level voltage) is supplied from the i-th scan line S1, the second transistor T2 may be turned on to electrically connect the j-th data line DLj with the first node N1. The first node N1 may be a point at which the second terminal of the second transistor T2 and the gate electrode of the first transistor T1 are connected (e.g., electrically connected) to each other. The second transistor T2 may transmit a data signal to the gate electrode of the first transistor T1.

In case that a sensing signal is supplied from the i-th sensing line SLi, the third transistor T3 may be turned on so that the j-th reference voltage line RFj may be connected (e.g., electrically connected) to the first transistor T1 (or the second node N2). A first terminal of the third transistor T3 may be connected (e.g., electrically connected) to the j-th reference voltage line RFj. A second terminal of the third transistor T3 may be connected (e.g., electrically connected) to the second node N2. A gate electrode of the third transistor T3 may be connected (e.g., electrically connected) to the i-th sensing line SLi.

The third transistor T3 may be a sensing transistor which operates to supply, to the second node N2, a reference voltage Vref transmitted from the j-th reference voltage line RFj, or to sense a voltage or current of the second node N2 or the j-th reference voltage line RFj. For example, the reference voltage Vref may be a voltage, e.g., a voltage of an initialization power supply, which is less than the voltage of the first driving power supply ELVDD and/or the data voltage.

The storage capacitor Cst may include a first storage electrode and a second storage electrode. A first storage electrode of the storage capacitor Cst may be connected (e.g., electrically connected) to the first node N1. A second storage electrode of the storage capacitor Cst may be connected (e.g., electrically connected) to the second node N2. The storage capacitor Cst may be charged with a data voltage corresponding to a data signal to be supplied to the first node N1 during one frame period. The storage capacitor Cst may store a voltage corresponding to a difference between a voltage of the gate electrode of the first transistor T1 and a voltage of the second node N2.

Although FIG. 4 illustrate an embodiment where all of the first, second, and third transistors T1, T2, and T3 included in the pixel circuit PXC are formed of N-type transistors, embodiments are not limited thereto. For example, at least one of the first, second, and third transistors T1, T2, and T3 may be modified to a P-type transistor or an oxide transistor.

In an embodiment, for descriptive convenience, a horizontal direction (or an X-axis direction) in a plan view is indicated by a first direction DR1, and a vertical direction (or a Y-axis direction) in a plan view is indicated by a second direction DR2. Furthermore, a vertical direction in a sectional view is indicated by a third direction DR3.

Figure 5:
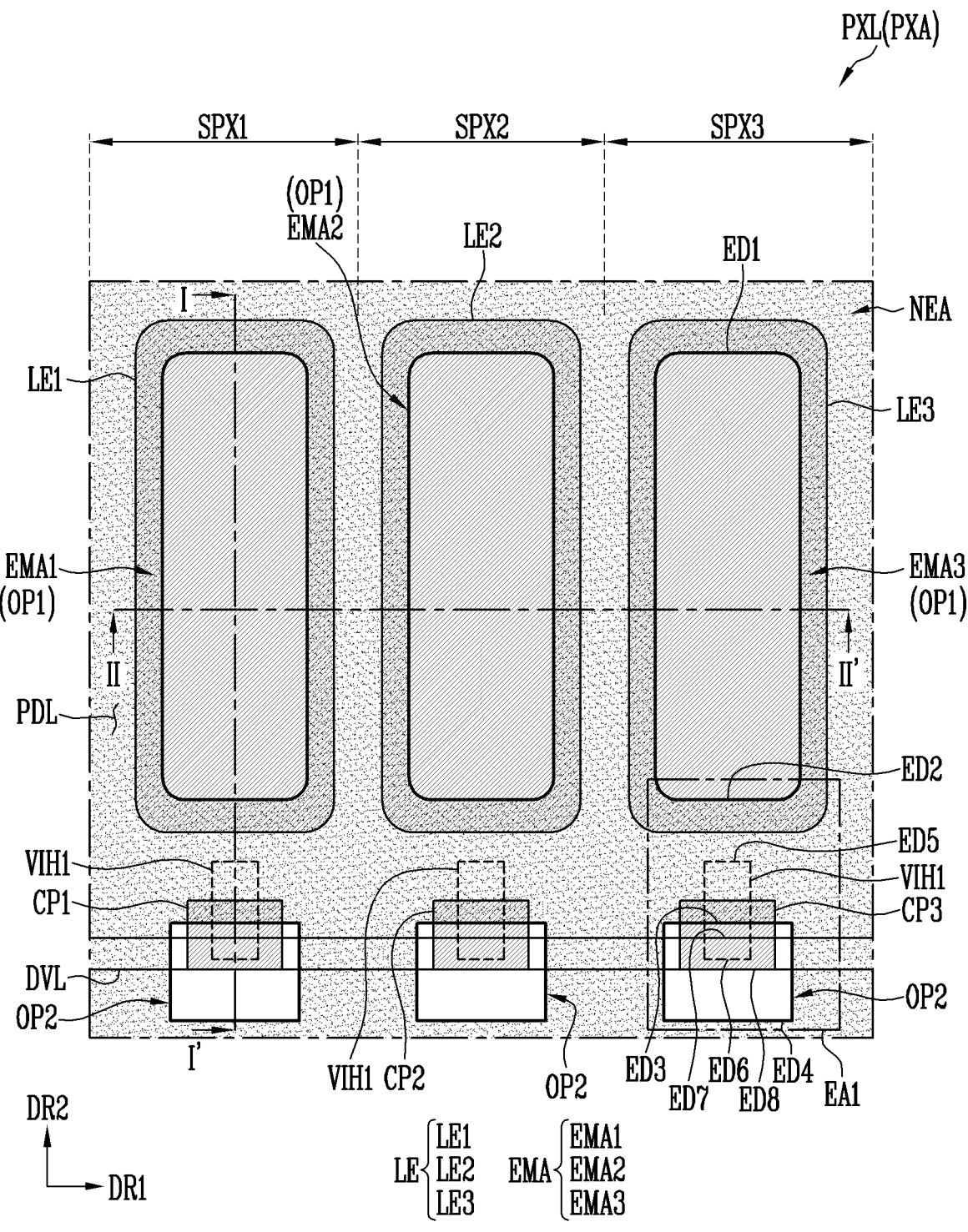
FIG. 5 is a schematic plan view illustrating a pixel in accordance with an embodiment.
Figure 6:
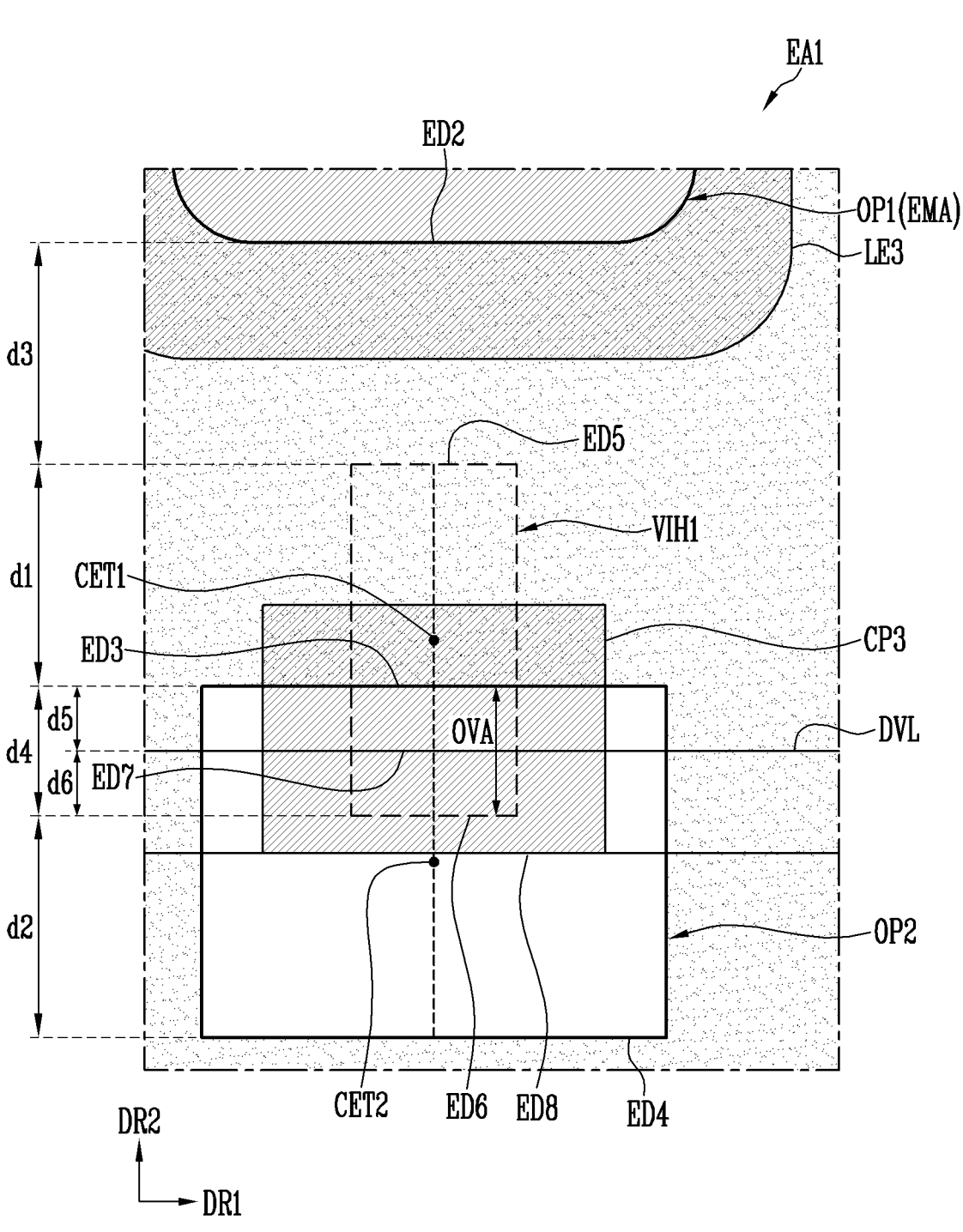
FIG. 6 is a schematic enlarged view of portion EA1 of FIG. 5.

FIG. 5 is a schematic plan view illustrating a pixel PXL in accordance with an embodiment. FIG. 6 is a schematic enlarged view illustrating portion EA1 of FIG. 5.

In FIGS. 5 and 6, not only the components included in the pixel PXL but also an area in which the components are provided (or positioned) may be embraced in the definition of the term "pixel PXL".

Referring to FIGS. 1 to 6, the pixel PXL may be disposed in a pixel area PXA defined (or provided) in the display area DA. The pixel area PXA may include an emission area EMA and a non-emission area NEA.

The pixel PXL may include a first sub-pixel SPX1 (or a first pixel), a second sub-pixel SPX2 (or a second pixel), and a third sub-pixel SPX3 (or a third pixel).

The first sub-pixel SPX1 may include a first emission area EMA1 and a non-emission area NEA which is adjacent to the first emission area EMA1 (or encloses at least one side of the first emission area EMA1). The second sub-pixel SPX2 may include a second emission area EMA2 and a non-emission area NEA which is adjacent to the second emission area EMA2 (or encloses at least one side of the second emission area EMA2). The third sub-pixel SPX3 may include a third emission area EMA3 and a non-emission area NEA which is adjacent to the third emission area EMA3 (or encloses at least one side of the third emission area EMA3). The first emission area EMA1, the second emission area EMA2, and the third emission area EMA3 may form the emission area EMA of the pixel PXL.

In an embodiment, the first sub-pixel SPX1 may be a red sub-pixel emitting red light, the second sub-pixel SPX2 may be a green sub-pixel emitting green light, and the third sub-pixel SPX3 may be a blue sub-pixel emitting blue light.

Each of the first, second, and third sub-pixels SPX1, SPX2, and SPX3 may include a light emitting element (refer to "LD" of FIG. 4) emitting light, and a pixel circuit (refer to "PXC" of FIG. 4) that drives the light emitting element LD. The first emission area EMA1 may be an area where light is emitted from the light emitting element that is driven by the pixel circuit of the first sub-pixel SPX1. The second emission area EMA2 may be an area where light is emitted from the light emitting element that is driven by the pixel circuit of the second sub-pixel SPX2. The third emission area EMA3 may be an area where light is emitted from the light emitting element that is driven by the pixel circuit of the third sub-pixel SPX3.

The light emitting element disposed in the first sub-pixel SPX1 may include a first-first electrode LE1 (or a first lower electrode), a first emission layer (refer to "EML1" of FIG. 9) positioned on the first-first electrode LE1, and a second electrode (refer to "UE" of FIG. 7 or an upper electrode) positioned on the first emission layer EML1. In the case where the first sub-pixel SPX1 is a red sub-pixel, the first emission layer EML1 may emit red light.

The light emitting element disposed in the second sub-pixel SPX2 may include a first-second electrode LE2 (or a second lower electrode), a second emission layer (refer to "EML2" of FIG. 9) positioned on the first-second electrode LE2, and a second electrode UE (or an upper electrode) positioned on the second emission layer EML2. In the case where the second sub-pixel SPX2 is a green sub-pixel, the second emission layer EML2 may emit green light.

The light emitting element disposed in the third sub-pixel SPX3 may include a first-third electrode LE3 (or a third lower electrode), a third emission layer (refer to "EML3" of FIG. 9) positioned on the first-third electrode LE3, and a second electrode UE (or an upper electrode) positioned on the third emission layer EML3. In the case where the third sub-pixel SPX3 is a blue sub-pixel, the third emission layer EML3 may emit blue light.

The second electrode UE of the first sub-pixel SPX1, the second electrode UE of the second sub-pixel SPX2, and the second electrode UE of the third sub-pixel SPX3 may form a common layer formed in common in the adjacent sub-pixels SPX. The first-first electrode LE1, the first-second electrode LE2, and the first-third electrode LE3 may form the first electrode LE of the pixel PXL.

The pixel PXL may include a pixel defining layer PDL which encloses (or surrounds) the emission area EMA.

The pixel defining layer PDL may enclose (or surround) the first, second, and third emission areas EMA1, EMA2, and EMA3. The pixel defining layer PDL may be a structure for defining (or partitioning) the first, second, and third emission areas EMA1, EMA2, and EMA3. The pixel defining layer PDL may define a supply position of the first emission layer EML1 during a process of depositing the first emission layer EML1 to the first sub-pixel SPX1, may define a supply position of the second emission layer EML2 during a process of depositing the second emission layer EML2 to the second sub-pixel SPX2, and may define a supply position of the third emission layer EML3 during a process of depositing the third emission layer EML3 to the third sub-pixel SPX3.

The pixel defining layer PDL may include a first opening OP1 and a second opening OP2. The first opening OP1 may correspond to (or overlap) each of the first, second, and third emission areas EMA1, EMA2, and EMA3.

In the pixel area PXA, the second opening OP2 may be disposed at a position spaced apart from the first opening OP1, and disposed adjacent to a side of the pixel area PXA (e.g., a lower side of the pixel area PXA). The second opening OP2 may be disposed in the non-emission area NEA of each of the first, second, and third sub-pixels SPX1, SPX2, and SPX3.

In an embodiment, the first opening OP1 and the second opening OP2 may be disposed at positions spaced apart from each other in a direction, e.g., in the second direction DR2. For example, the first opening OP1 and the second opening OP2 may be disposed at positions spaced apart from each other in the second direction DR2 in each of the first, second, and third sub-pixels SPX1, SPX2, and SPX3.

In each of the first, second, and third sub-pixels SPX1, SPX2, and SPX3, the pixel defining layer PDL may include a first edge ED1 (e.g., a first side surface) and a second edge ED2 (e.g., a second side surface) which face each other in the second direction DR2 with the first opening OP1 interposed therebetween, and may include a third edge ED3 (e.g., a first side surface) and a fourth edge ED4 (e.g., a second side surface) which face each other in the second direction DR2 with the second opening OP2 interposed therebetween.

The driving voltage line DVL extending in the first direction DR1 may be disposed in the non-emission area NEA of the pixel area PXA.

The driving voltage line DVL may be a component formed in common in the first, second, and third sub-pixels SPX1, SPX2, and SPX3. The voltage of the first driving power supply ELVDD or the voltage of the second driving power supply ELVSS may be applied to the driving voltage line DVL. The driving voltage line DVL may be connected (e.g., electrically connected) to the light emitting element of each of the first, second, and third sub-pixels SPX1, SPX2, and SPX3.

In an embodiment, the driving voltage line DVL may include a seventh edge ED7 (or a first side surface) and an eighth edge ED8 (or a second side surface) which face each other in the second direction DR2. The driving voltage line DVL may be exposed through a first via hole VIH1 in the non-emission area NEA of each of the first, second, and third sub-pixels SPX1, SPX2, and SPX3. For example, in each of the first, second, and third sub-pixels SPX1, SPX2, and SPX3, the seventh edge ED7 of the driving voltage line DVL may be positioned in the first via hole VIH1 and exposed through the first via hole VIH1.

The first sub-pixel SPX1 may include a first conductive pattern layer CP1 which overlaps (e.g., partially overlaps) an area of the driving voltage line DVL. The second sub-pixel SPX2 may include a second conductive pattern layer CP2 which overlaps (e.g., partially overlaps) another area of the driving voltage line DVL. The third sub-pixel SPX3 may include a third conductive pattern layer CP3 which overlaps (e.g., partially overlaps) another area of the driving voltage line DVL. Each of the first, second, and third conductive pattern layers CP1, CP2, and CP3 may be disposed on the driving voltage line DVL exposed through the first via hole VIH1, and connected (e.g., electrically connected) to the driving voltage line DVL.

Each of the first, second, and third conductive pattern layers CP1, CP2, and CP3 may contact the second electrode UE and be connected (e.g., electrically connected) to the second electrode UE.

The first via hole VIH1 may be positioned in the non-emission area NEA of each of the first, second, and third sub-pixels SPX1, SPX2, and SPX3. The first via hole VIH1 may be a through hole which passes through a via layer (refer to "VIA" of FIG. 7) disposed under the pixel defining layer PDL, and may partially expose components, e.g., the driving voltage line DVL, disposed under the via layer VIA. In each of the first, second, and third sub-pixels SPX1, SPX2, and SPX3, the via layer VIA may include a fifth edge ED5 (e.g., a first side surface) and a sixth edge ED6 (e.g., a second side surface) which face each other in the second direction DR2 with the first via hole VIH1 interposed therebetween.

In an embodiment, the first opening OP1 of the pixel defining layer PDL, the first via hole VIH1 of the via layer VIA, and the second opening OP2 of the pixel defining layer PDL may be disposed (e.g., sequentially arranged) in a direction, e.g., in the second direction DR2. The first opening OP1 and the first via hole VIH1 may be spaced apart from each other. The first via hole VIH1 and the second opening OP2 may overlap (e.g., partially overlap) each other. The second edge ED2 of the pixel defining layer PDL and the fifth edge ED5 of the via layer VIA may be spaced apart from each other by a third distance d3 in the second direction DR2. The fifth edge ED5 and the third edge ED3 of the pixel defining layer PDL may be spaced apart from each other by a first distance d1 in the second direction DR2. The third edge ED3 and the sixth edge ED6 of the via layer VIA may be spaced apart from each other by a fourth distance d4 in the second direction DR2. The sixth edge ED6 and the fourth edge ED4 of the pixel defining layer PDL may be spaced apart from each other by a second distance d2 in the second direction DR2.

In an embodiment, the first distance d1, the second distance d2, and the third distance d3 may be substantially the same as each other. For example, the first distance d1, the second distance d2, and the third distance d3 each may be about 8 μm, but embodiments are not limited thereto. The fourth distance d4 may be less than each of the first distance d1, the second distance d2, and the third distance d3. For example, the fourth distance d4 may be about 6 μm, but embodiments are not limited thereto. In an embodiment, the fourth distance d4 may be substantially the same as each of the first distance d1, the second distance d2, and the third distance d3.

A portion of the driving voltage line DVL may be disposed in an overlap area OVA in which the second opening OP2 and the first via hole VIH1 overlap each other, for example, in an area between the third edge ED3 of the pixel defining layer PDL and the sixth edge ED6 of the via layer VIA. In the overlap area OVA, the third edge ED3 of the pixel defining layer PDL and the seventh edge ED7 of the driving voltage line DVL may be spaced apart from each other by a fifth distance d5, and the seventh edge ED7 of the driving voltage line DVL and the sixth edge ED6 of the via layer VIA may be spaced apart from each other by a sixth distance d6. The fifth distance d5 and the sixth distance d6 may be substantially the same as each other. For example, the fifth distance d5 and the sixth distance d6 each may be about 3 μm, but embodiments are not limited thereto.

As described above, in the non-emission area NEA of each of the first, second, and third sub-pixels SPX1, SPX2, and SPX3, the first via hole VIH1 of the via layer VIA and the second opening OP2 of the pixel defining layer PDL may overlap (e.g., partially overlap) each other. For example, a first central point CET1 that divides the first via hole VIH1 into two same portions in the first direction DR1 and the second direction DR2 and a second central point CET2 that divides the second opening OP2 into two same portions in the first direction DR1 and the second direction DR2 may be spaced apart from each other, rather than coinciding. For example, a location of the first central point CET1 of the first via hole VIH1 and a location of the second central point CET2 of the second opening OP2 may differ from each other. Hence, the first via hole VIH1 and the second opening OP2 that form a gentle inclination (or the via layer VIA and the pixel defining layer PDL that have a smooth profile) may be formed around the overlap area OVA in which the first via hole VIH1 and the second opening OP2 overlap each other. For example, a step coverage in a subsequent process, which is performed after the pixel defining layer PDL has been formed, may be improved.

Hereinafter, the stacked structure of the pixel PXL in accordance with the foregoing embodiment will be described with reference to FIGS. 7 to 9.

Figure 7:
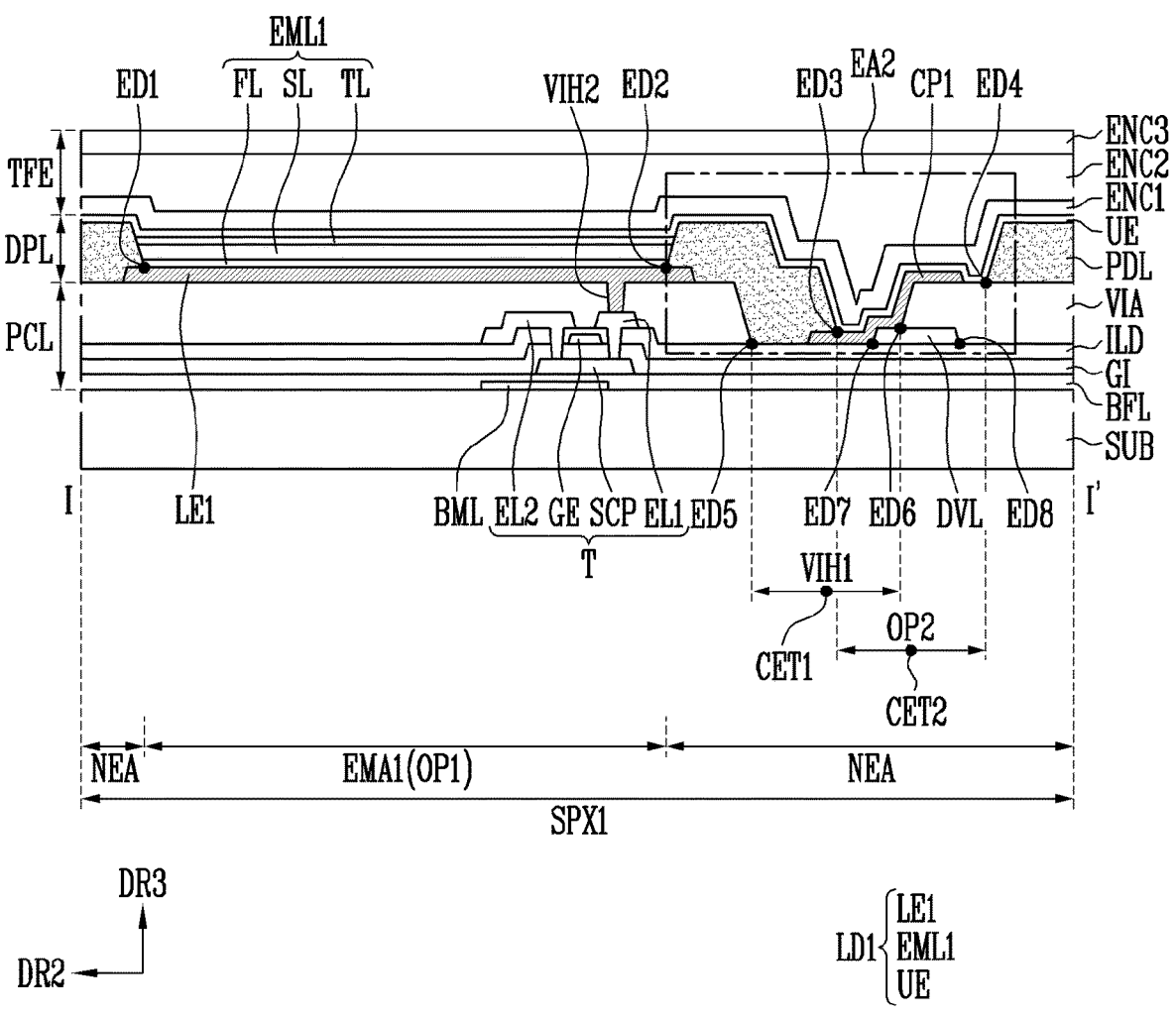
FIG. 7 is a schematic cross-sectional view taken along line I-I' of FIG. 5.

FIG. 7 is a schematic cross-sectional view taken along line I-I' of FIG. 5. FIG. 8 is a schematic enlarged view of portion EA2 of FIG. 7. FIG. 9 is a schematic cross-sectional view taken along line II-IF of FIG. 5.

Figure 8:
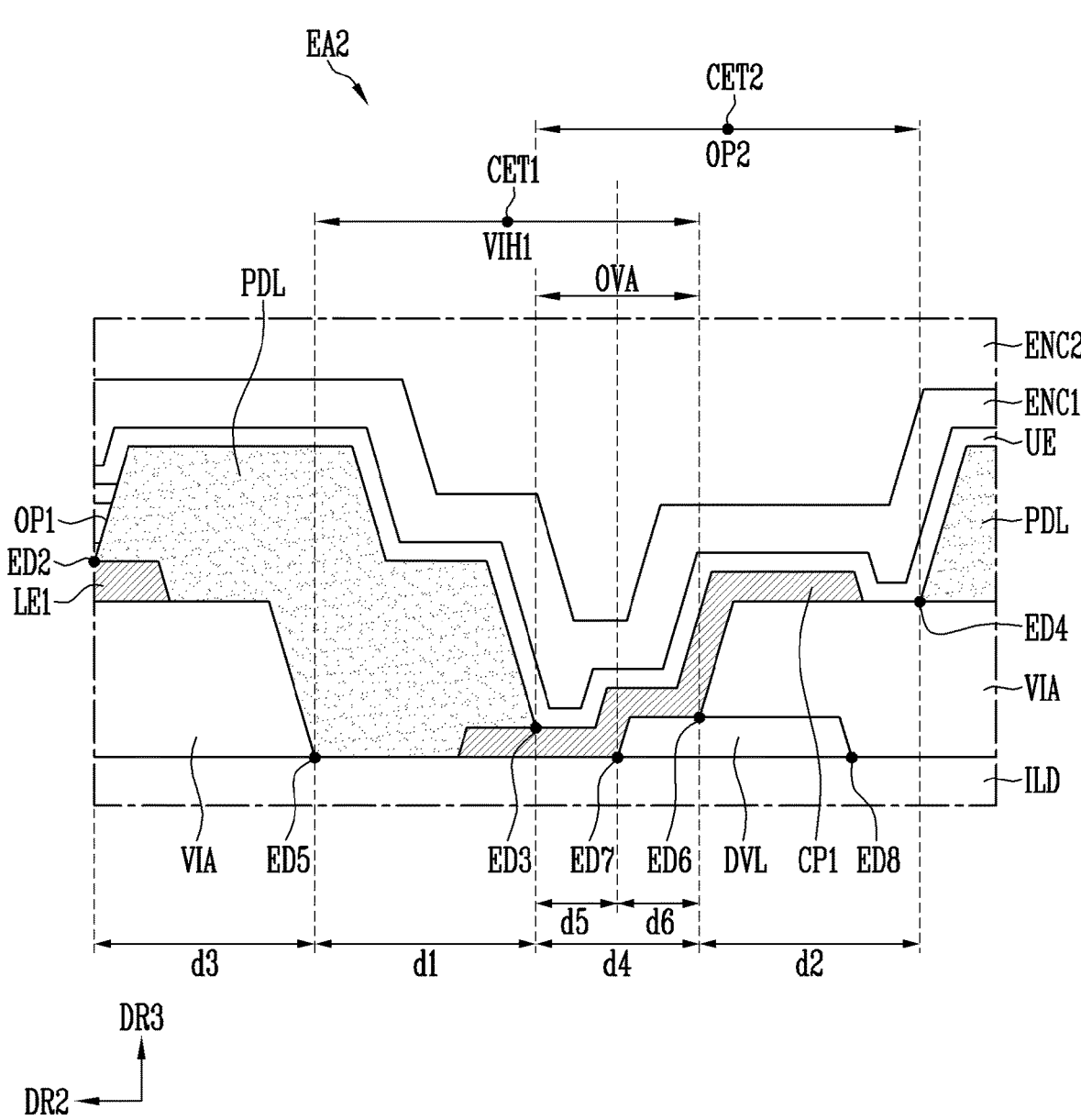
FIG. 8 is a schematic enlarged view of portion EA2 of FIG. 7.
Figure 9:
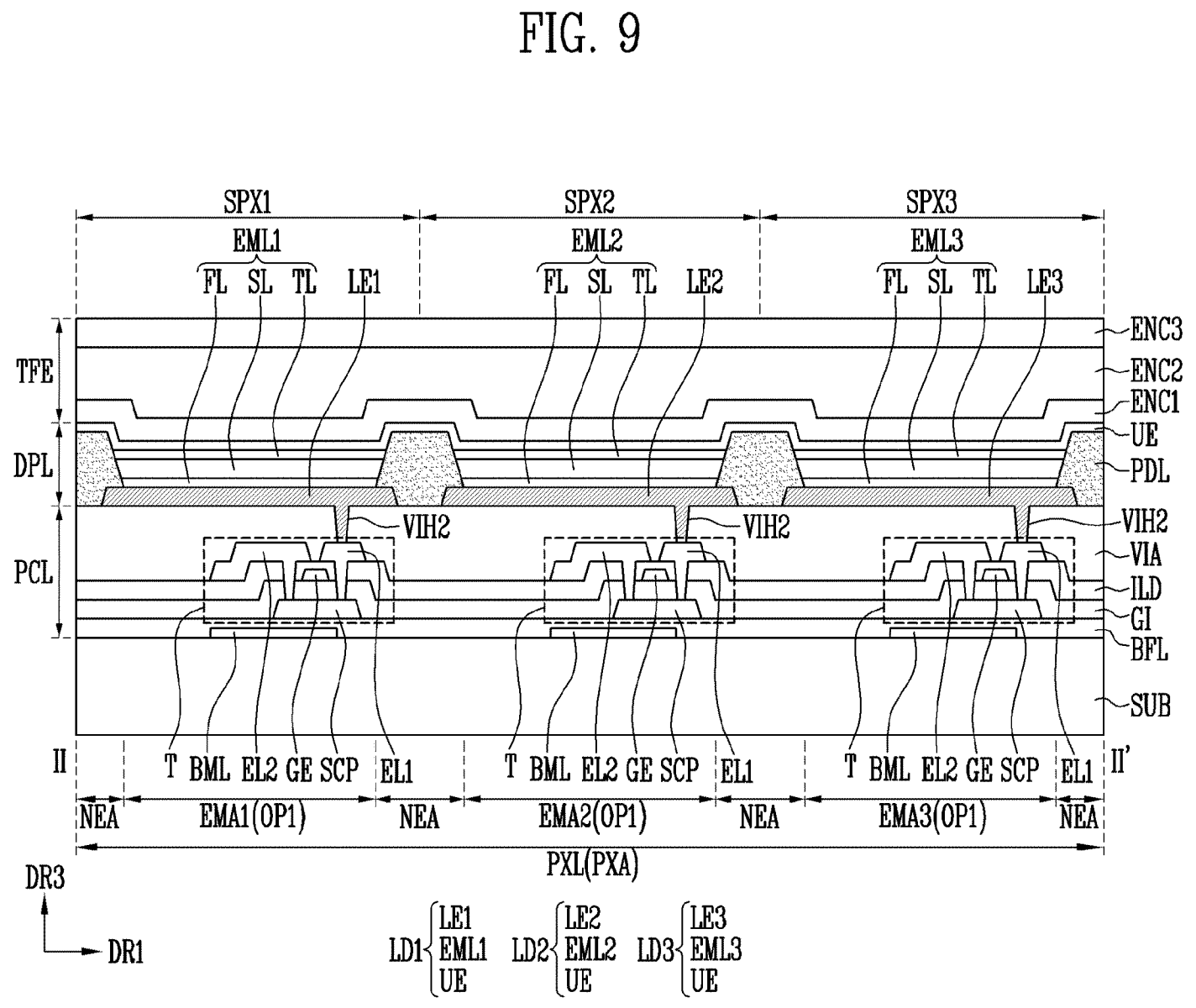

The following description related to embodiments of FIGS. 7 to 9 will describe differences from the above-mentioned embodiments so as to avoid redundant description.

Referring to FIGS. 1 to 9, each of the first, second, and third sub-pixels SPX1, SPX2, and SPX3 may include a substrate SUB, a pixel circuit layer PCL, a display element layer DPL, and a thin-film encapsulation layer TFE.

The pixel circuit layer PCL and the display element layer DPL may be disposed on a surface of the substrate SUB and overlap each other. For example, the pixel area PXA, the pixel circuit layer PCL may be disposed on a surface of the substrate SUB, and the display element layer DPL may be disposed on the pixel circuit layer PCL. However, relative positions of the pixel circuit layer PCL and the display element layer DPL on the substrate SUB may be changed according to embodiments.

The substrate SUB may include transparent insulating material transmitting light. The substrate SUB may be a rigid substrate or a flexible substrate.

In each pixel area PXA, circuit elements (e.g., transistors T) for forming the pixel circuit PXC of each of the first, second, and third sub-pixels SPX1, SPX2, and SPX3 and signal lines connected (e.g., electrically connected) to the circuit elements may be disposed. Furthermore, the driving voltage line DVL may be disposed in each pixel area PXA. The light emitting element LD connected (e.g., electrically connected) to the pixel circuit PXC of each of the first, second, and third sub-pixels SPX1, SPX2, and SPX3 may be disposed in each pixel area PXA of the display element layer DPL.

The pixel circuit layer PCL may include at least one or more insulating layers as well as including the circuit elements, the signal lines, and the driving voltage line DVL. For example, the pixel circuit layer PCL may include a buffer layer BFL, a gate insulating layer GI, an interlayer insulating layer ILD, and a via layer VIA which are successively (or sequentially) stacked on the substrate SUB in the third direction DR3.

The buffer layer BFL may be disposed on the overall surface of the substrate SUB. The buffer layer BFL may prevent impurities from diffusing (or permeating) into a transistor T included in the pixel circuit PXC. The buffer layer BFL may be an inorganic insulating layer including inorganic material. The buffer layer BFL may include at least one of silicon nitride ($SiN_x$), silicon oxide ($SiO_x$), silicon oxynitride ($SiO_xN_y$), and aluminum oxide ($AlO_x$). Although the buffer layer BFL may be formed in a single-layer structure, the buffer layer BFL may be formed in a multi-layer structure having at least two or more layers. In the case where the buffer layer BFL has a multi-layer structure, the respective layers may be formed of the same material or different materials. The buffer layer BFL may be omitted according to the material of the substrate SUB or processing conditions.

The gate insulating layer GI may be disposed on the overall surface of the buffer layer BFL. The gate insulating layer GI and the buffer layer BFL may include the same material. For example, the gate insulating layer GI may include suitable (or selected) material among the materials as the constituent materials of the buffer layer BFL. The gate insulating layer GI may be an inorganic insulating layer including inorganic material.

The interlayer insulating layer ILD may be provided and/or formed on the surface (e.g., the overall surface) of the gate insulating layer GI. The interlayer insulating layer ILD and the buffer layer BFL may include the same material. For example, the interlayer insulating layer ILD include one or more suitable (or selected) materials among the materials as the constituent materials of the buffer layer BFL.

The via layer VIA may be provided and/or formed on the overall surface of the interlayer insulating layer ILD. The via layer VIA may be an inorganic insulating layer including inorganic material or an organic insulating layer including organic material. The inorganic insulating layer may include, for example, at least one of silicon oxide ($SiO_x$), silicon nitride ($SiN_x$), silicon oxynitride ($SiO_xN_y$), and aluminum oxide ($AlO_x$). The organic insulating layer may include, for example, at least one of polyacrylic resin, epoxy resin, phenolic resin, polyamide resin, polyimide rein, unsaturated polyester resin, poly-phenylen ether resin, polyphenylene sulfide resin, and benzocyclobutene resin. In an embodiment, the via layer VIA may be formed of an organic insulating layer including organic material.

The via layer VIA may include via holes. For example, the via layer VIA may be partially open to include the first via hole VIH1 and the second via hole VIH2. The first via hole VIH1 may be disposed in the non-emission area NEA of each of the first, second, and third sub-pixels SPX1, SPX2, and SPX3, but embodiments are not limited thereto. The second via hole VIH2 may be disposed in the respective emission areas EMA1, EMA2, and EMA3 of the first, second, and third sub-pixels SPX1, SPX2, and SPX3. For example, the second via hole VIH2 in the first sub-pixel SPX1 may be positioned in the first emission area EMA1. The second via hole VIH2 in the second sub-pixel SPX2 may be positioned in the second emission area EMA2. The second via hole VIH2 in the third sub-pixel SPX3 may be positioned in the third emission area EMA3.

In an embodiment, the via layer VIA may function as a planarization layer formed to mitigate (or minimize) a step difference which occurs due to components of the pixel circuit PXC that are disposed under the via layer VIA in the pixel circuit layer PCL.

The pixel circuit PXC disposed in the pixel circuit layer PCL may include at least one transistor T. The transistor T may be a driving transistor that controls driving current of each of the first, second, and third light emitting elements LD1, LD2, and LD3, and have the same configuration as that of the first transistor T1 described with reference to FIG. 4.

The transistor T may include a semiconductor pattern layer SCP, a gate electrode GE, a first terminal EL1, and a second terminal EL2.

The gate electrode GE may be disposed on the gate insulating layer GI and may be covered by the interlayer insulating layer ILD. For example, the gate electrode GE may be a gate conductive layer disposed between the gate insulating layer GI and the interlayer insulating layer ILD. The gate electrode GE may overlap a portion of the semiconductor pattern layer SCP. For example, the gate electrode GE may overlap an active pattern layer of the semiconductor pattern layer SCP.

The semiconductor pattern layer SCP may be provided and/or formed on the buffer layer BFL. For example, the semiconductor pattern layer SCP may be disposed between the buffer layer BFL and the gate insulating layer GI. The semiconductor pattern layer SCP may be a semiconductor layer formed of poly silicon, amorphous silicon, an oxide semiconductor, and the like. The semiconductor pattern layer SCP may include an active pattern layer, a first contact area, and a second contact area. The active pattern layer, the first contact area, and the second contact area each may be formed of a semiconductor layer that is doped with no impurity or doped with an impurity (or dopant). For example, the first contact area and the second contact area each may be formed of a semiconductor layer that is doped with an impurity (or dopant), and the active pattern layer may be formed of an undoped semiconductor layer. For example, an N-type impurity (or N-type dopant) may be the impurity, but embodiments are not limited thereto.

The active pattern layer of the semiconductor pattern layer SCP may be an area which overlaps the gate electrode GE of the transistor T, and be a channel area. The first contact area of the semiconductor pattern layer SCP may contact one end of the active pattern layer. Furthermore, the first contact area may be connected (e.g., electrically connected) to the first terminal EL1. The second contact area of the semiconductor pattern layer SCP may contact a remaining end of the active pattern layer. Furthermore, the second contact area may be connected (e.g., electrically connected) to the second terminal EL2.

The first terminal EL1 of the transistor T may be provided and/or formed on the interlayer insulating layer ILD. For example, the first terminal EL1 of the transistor T may be formed of a source-drain conductive layer formed between the interlayer insulating layer ILD and the via layer VIA. The first terminal EL1 of the transistor T may contact the first contact area of the semiconductor pattern layer SCP through a contact hole that passes through the gate insulating layer GI and the interlayer insulating layer ILD.

The second terminal EL2 of the transistor T may be provided and/or formed on the interlayer insulating layer ILD and spaced apart from the first terminal EL1 of the transistor T. The second terminal EL2 of the transistor T may be formed of a source-drain conductive layer formed between the interlayer insulating layer ILD and the via layer VIA. The second terminal EL2 of the transistor T may contact the second contact area of the semiconductor pattern layer SCP through a contact hole that passes through the gate insulating layer GI and the interlayer insulating layer ILD.

A bottom metal pattern layer BML may be disposed under the transistor T.

The bottom metal pattern layer BML may be a first conductive layer disposed between the substrate SUB and the buffer layer BFL. The bottom metal pattern layer BML may be connected (e.g., electrically connected) to the transistor T and thus increase a driving range of a certain voltage to be supplied to the gate electrode GE of the transistor T. For example, the bottom metal pattern layer BML may be connected (e.g., electrically connected) to the transistor T and stabilize the channel area of the transistor T. Furthermore, as the bottom metal pattern layer BML is connected (e.g., electrically connected) to the transistor T, the bottom metal pattern layer BML may be prevented from floating.

Although in the foregoing embodiment there has been illustrated the case where the transistor T is a thin-film transistor having a top gate structure, embodiments are not limited thereto. The structure of the transistor T may be changed in various ways.

The pixel circuit layer PCL may include the driving voltage line DVL formed in common in the respective non-emission areas NEA of the first, second, and third sub-pixels SPX1, SPX2, and SPX3.

The driving voltage line DVL may be provided and/or formed on the interlayer insulating layer ILD. For example, the driving voltage line DVL may be formed of a source-drain conductive layer positioned between the interlayer insulating layer ILD and the via layer VIA. The driving voltage line DVL may be formed in the same layer as the first and second terminals EL1 and EL2. For example, the driving voltage line DVL and the first and second terminals EL1 and EL2 may be formed by the same process, may be formed of the same material, and may be disposed in the same layer or at the same level.

Although the voltage of the first driving power supply ELVDD may be applied to the driving voltage line DVL, embodiments are not limited thereto. In an embodiment, the voltage of the second driving power supply ELVSS may be applied to the driving voltage line DVL. For example, in the case where the first-first electrode LE1 of the first sub-pixel SPX1, and the first-second electrode LE2 of the second sub-pixel SPX2, the first-third electrode LE3 of the third sub-pixel SPX3 each is an anode, the voltage of the second driving power supply ELVSS may be applied to the driving voltage line DVL. In the case where the first-first electrode LE1 of the first sub-pixel SPX1, and the first-second electrode LE2 of the second sub-pixel SPX2, the first-third electrode LE3 of the third sub-pixel SPX3 each is a cathode, the voltage of the first driving power supply ELVDD may be applied to the driving voltage line DVL.

The via layer VIA may be disposed on the transistor T and the driving voltage line DVL. The via layer VIA may be partially open to include the first via hole VIH1 and the second via hole VIH2.

In each of the first, second, and third sub-pixels SPX1, SPX2, and SPX3, the second via hole VIH2 may expose the first terminal EL1 of the transistor T of the corresponding sub-pixel SPX. In the first sub-pixel SPX1, the first terminal EL1 of the transistor T that is exposed through the second via hole VIH2 of the via layer VIA may be connected (e.g., electrically connected) to the first-first electrode LE1 (or the first lower electrode). In the second sub-pixel SPX2, the first terminal EL1 of the transistor T that is exposed through the second via hole VIH2 of the via layer VIA may be connected (e.g., electrically connected) to the first-second electrode LE2 (or the second lower electrode). In the third sub-pixel SPX3, the first terminal EL1 of the transistor T that is exposed through the second via hole VIH2 of the via layer VIA may be connected (e.g., electrically connected) to the first-third electrode LE3 (or the third lower electrode).

In each of the first, second, and third sub-pixels SPX1, SPX2, and SPX3, the first via hole VIH1 may expose an area of the driving voltage line DVL. For example, the first via hole VIH1 in the first sub-pixel SPX1 may expose an area of the seventh edge ED7 (e.g., the first side surface) of the driving voltage line DVL. The first via hole VIH1 in the second sub-pixel SPX2 may expose another area of the seventh edge ED7 of the driving voltage line DVL. The first via hole VIH1 in the third sub-pixel SPX3 may expose another area of the seventh edge ED7 of the driving voltage line DVL.

The eighth edge ED8 (e.g., the second side surface) of the driving voltage line DVL may be covered by the via layer VIA in each of the first, second, and third sub-pixels SPX1, SPX2, and SPX3. For example, as illustrated in FIG. 7, the seventh edge ED7 of the driving voltage line DVL in the first sub-pixel SPX1 may be exposed through the first via hole VIH1. The eighth edge ED8 of the driving voltage line DVL may be covered by the via layer VIA such that the sixth the sixth edge ED6 of the via layer VIA may be disposed between the seventh edge ED7 and eighth edge ED8 of the driving voltage line DVL in a plan view. For example, the sixth edge ED6 of the via layer VIA may be disposed on a surface of the driving voltage line DVL.

The display element layer DPL may be positioned on the via layer VIA.

The display element layer DPL may include first, second, and third light emitting elements LD1, LD2, and LD3, first to third conductive pattern layers CP1, CP2, and CP3, and a pixel defining layer PDL. Each of the first, second, and third light emitting elements LD1, LD2, and LD3 may have the same configuration as that of the light emitting element LD described with reference to FIG. 3.

The first light emitting element LD1 may include a first-first electrode LE1, a first emission layer EML1, and a second electrode UE. The second light emitting element LD2 may include a first-second electrode LE2, a second emission layer EML2, and a second electrode UE. The third light emitting element LD3 may include a first-third electrode LE3, a third emission layer EML3, and a second electrode UE. Each of the first, second, and third light emitting elements LD1, LD2, and LD3 may be connected (e.g., electrically connected) to the transistor T of the corresponding sub-pixel SPX.

The first-first electrode LE1, the first-second electrode LE2, and the first-third electrode LE3 may be provided and/or formed on the via layer VIA in the corresponding sub-pixel SPX. The first-first electrode LE1, the first-second electrode LE2, and the first-third electrode LE3 may be spaced apart from each other.

The first-first electrode LE1, the first-second electrode LE2, and the first-third electrode LE3 each may be made of material having reflexibility. For example, the first-first electrode LE1, the first-second electrode LE2, and the first-third electrode LE3 each may be made of conductive material (or substance). The conductive material may include opaque metal. For example, the opaque metal may include metal such as silver (Ag), magnesium (Mg), aluminum (Al), platinum (Pt), palladium (Pd), gold (Au), nickel (Ni), neodymium (Nd), iridium (Ir), chrome (Cr), titanium (Ti), and an alloy thereof. However, the material of the first-first electrode LE1, the first-second electrode LE2, and the first-third electrode LE3 is not limited to that of the foregoing embodiment. In an embodiment, the first-first electrode LE1, the first-second electrode LE2, and the first-third electrode LE3 each may include transparent conductive material (or substance). The transparent conductive material (or substance) may include transparent conductive oxides such as indium tin oxide (ITO), indium zinc oxide (IZO), zinc oxide ($ZnO_x$), indium gallium zinc oxide (IGZO), and indium tin zinc oxide (ITZO), and a conductive polymer such as PEDOT (poly(3,4-ethylenedioxythiophene)). In the case where the first-first electrode LE1, the first-second electrode LE2, and the first-third electrode LE3 each include transparent conductive material (or substance), a separate conductive layer made of opaque metal for reflecting light emitted from the first, second, and third emission layers EML1, EML2, and EML3 in an image display direction of the display device DD (or an upward direction of the thin-film encapsulation layer TFE) may be formed.

The first-first electrode LE1 may be positioned in at least the first emission area EMA1. The first-second electrode LE2 may be positioned in at least the second emission area EMA2. The first-third electrode LE3 may be positioned in at least the third emission area EMA3.

The first conductive pattern layer CP1 may be disposed at a position spaced apart from the first-first electrode LE1 in the non-emission area NEA of the first sub-pixel SPX1. The first conductive pattern layer CP1 and the first-first electrode LE1 may be disposed in the same layer. For example, the first conductive pattern layer CP1 and the first-first electrode LE1 may be formed by the same process. The first conductive pattern layer CP1 and the first-first electrode LE1 may include the same material. A side of the first conductive pattern layer CP1 may be positioned in the first via hole VIH1 of the first sub-pixel SPX1. Another side of the first conductive pattern layer CP1 may be disposed on the via layer VIA including the sixth edge ED6.

The first conductive pattern layer CP1 may be positioned on an area of the seventh edge ED7 of the driving voltage line DVL that is exposed through the first via hole VIH1 of the via layer VIA in the first sub-pixel SPX1, and thus cover the driving voltage line DVL. The first conductive pattern layer CP1 may be a protective component which prevents the driving voltage line DVL from being damaged by etchant used during a process of forming the first-first electrode LE1.

The second conductive pattern layer CP2 may be disposed at a position spaced apart from the first-second electrode LE2 in the non-emission area NEA of the second sub-pixel SPX2. The second conductive pattern layer CP2 and the first-second electrode LE2 may be disposed in the same layer. For example, the second conductive pattern layer CP2 and the first-second electrode LE2 may be formed by the same process. The second conductive pattern layer CP2 and the first-second electrode LE2 may have the same material. A side of the second conductive pattern layer CP2 may be positioned in the first via hole VIH1 of the second sub-pixel SPX2. Another side of the second conductive pattern layer CP2 may be disposed on the via layer VIA including the sixth edge ED6.

The second conductive pattern layer CP2 may be positioned on another area of the seventh edge ED7 of the driving voltage line DVL that is exposed through the first via hole VIH1 of the via layer VIA in the second sub-pixel SPX2, and thus cover the driving voltage line DVL. The second conductive pattern layer CP2 may be a protective component which prevents the driving voltage line DVL from being damaged by etchant used during a process of forming the first-second electrode LE2.

The third conductive pattern layer CP3 may be disposed at a position spaced apart from the first-third electrode LE3 in the non-emission area NEA of the third sub-pixel SPX3. The third conductive pattern layer CP3 and the first-third electrode LE3 may be disposed in the same layer. For example, the third conductive pattern layer CP3 and the first-third electrode LE3 may be formed through the same process. The third conductive pattern layer CP3 and the first-third electrode LE3 may include the same material. A side of the third conductive pattern layer CP3 may be positioned in the first via hole VIH1 of the third sub-pixel SPX3. Another side of the third conductive pattern layer CP3 may be disposed on the via layer VIA including the sixth edge ED6.

The third conductive pattern layer CP3 may be positioned on another area of the seventh edge ED7 of the driving voltage line DVL that is exposed through the first via hole VIH1 of the via layer VIA in the third sub-pixel SPX3, and thus cover the driving voltage line DVL. The third conductive pattern layer CP3 may be a protective component which prevents the driving voltage line DVL from being damaged by etchant used during a process of forming the first-third electrode LE3.

The pixel defining layer PDL may be provided and/or formed on the first-first, first-second, and first-third electrodes LE1, LE2, and LE3 and the first, second, and third conductive pattern layers CP1, CP2, and CP3.

The pixel defining layer PDL may define (or partition) the first emission area EMA1, the second emission area EMA2, and the third emission area EMA3. The pixel defining layer PDL may be an organic insulating layer made of organic material. The organic material may include acryl resin, epoxy resin, phenolic resin, polyamide resin, polyimide resin, and the like. In an embodiment, the pixel defining layer PDL may include light absorbing material or be coated with light absorbent, so that the pixel defining layer PDL may function to absorb light introduced from the outside. For example, the pixel defining layer PDL may include carbon-based black pigment. Embodiments are not limited thereto.

The pixel defining layer PDL may be partially open to include the first opening OP1 which exposes an area of each of the first-first, first-second, and first-third electrodes LE1, LE2, and LE3, and the second opening OP2 spaced from the first opening OP1, and may protrude from the via layer VIA in the third direction DR3 along the periphery area of each of the first, second, and third emission areas EMA1, EMA2, and EMA3.

In the first sub-pixel SPX1, the first opening OP1 of the pixel defining layer PDL may correspond to (or overlap) the first emission area EMA1. In the second sub-pixel SPX2, the first opening OP1 of the pixel defining layer PDL may correspond to (or overlap) the second emission area EMA2. In the third sub-pixel SPX3, the first opening OP1 of the pixel defining layer PDL may correspond to (or overlap) the third emission area EMA3.

In the first sub-pixel SPX1, the second opening OP2 of the pixel defining layer PDL may be positioned in the non-emission area NEA adjacent to the first emission area EMA1 and overlap (e.g., partially overlap) the first via hole VIH1 of the via layer VIA. The second opening OP2 may expose the first conductive pattern layer CP1.

In the second sub-pixel SPX2, the second opening OP2 of the pixel defining layer PDL may be positioned in the non-emission area NEA adjacent to the second emission area EMA2 and overlap (e.g., partially overlap) the first via hole VIH1 of the via layer VIA. The second opening OP2 may expose the second conductive pattern layer CP2.

In the third sub-pixel SPX3, the second opening OP2 of the pixel defining layer PDL may be positioned in the non-emission area NEA adjacent to the third emission area EMA3 and overlap (e.g., partially overlap) the first via hole VIH1 of the via layer VIA. The second opening OP2 may expose the third conductive pattern layer CP3.

The first emission layer EML1, the second emission layer EML2, and the third emission layer EML3 may be respectively provided and/or formed on the first-first electrode LE1, the first-second electrode LE2, and the first-third electrode LE3 that are exposed through the first opening OP1 of the pixel defining layer PDL. For example, in the first sub-pixel SPX1, the first emission layer EML1 may be provided and/or formed on the first-first electrode LE1 that is exposed through the first opening OP1 of the pixel defining layer PDL. In the second sub-pixel SPX2, the second emission layer EML2 may be provided and/or formed on the first-second electrode LE2 that is exposed through the first opening OP1 of the pixel defining layer PDL. In the third sub-pixel SPX3, the third emission layer EML3 may be provided and/or formed on the first-third electrode LE3 that is exposed through the first opening OP1 of the pixel defining layer PDL.

The first emission layer EML1 may be positioned on only first-first electrode LE1 in the first opening OP1 of the pixel defining layer PDL. The second emission layer EML2 may be positioned on only the first-second electrode LE2 in the first opening OP1 of the pixel defining layer PDL. The third emission layer EML3 may be positioned on only the first-third electrode LE3 in the first opening OP1 of the pixel defining layer PDL. Each of the first emission layer EML1, the second emission layer EML2, and the third emission layer EML3 may be deposited to a target area of the corresponding sub-pixel SPX (e.g., over an area of the first electrode LE that is exposed through the first opening OP1 of the pixel defining layer PDL) by an inkjet printing method or the like.

In an embodiment, each of the first, second, and third emission layers EML1, EML2, and EML3 may include a first layer FL, a second layer SL, and a third layer TL which are successively (or sequentially) stacked in the third direction DR3.

The first layer FL may include a hole transport layer for injection and/or transport of holes, but embodiments are not limited thereto. In an embodiment, the first layer FL may include an electron transport layer for injection and/or transport of electrons. For example, in the case where each of the first-first, first-second, and first-third electrodes LE1, LE2, and LE3 is an anode, the first layer FL may include a hole transport layer. In another example, in the case where each of the first-first, first-second, and first-third electrodes LE1, LE2, and LE3 is a cathode, the first layer FL may include an electron transport layer.

The second layer SL may include a light generation layer emitting light by recombination of injected electrons and holes. For example, in the first sub-pixel SPX1, the second layer SL may include a light generation layer emitting red light by recombination of injected electrons and holes. In the second sub-pixel SPX2, the second layer SL may include a light generation layer emitting green light by recombination of injected electrons and holes. In the third sub-pixel SPX3, the second layer SL may include a light generation layer emitting blue light by recombination of injected electrons and holes.

The third layer TL may include an electron transport layer for injection and/or transport of electrons, but embodiments are not limited thereto. In an embodiment, the third layer TL may include a hole transport layer for injection and/or transport of holes. For example, in the case where each of the first-first, first-second, and first-third electrodes LE1, LE2, and LE3 is an anode, the third layer TL may include an electron transport layer. In another example, in the case where each of the first-first, first-second, and first-third electrodes LE1, LE2, and LE3 is a cathode, the third layer TL may include a hole transport layer.

Each of the first layer FL, the second layer SL, and the third layer TL may be positioned in the first opening OP1 of the pixel defining layer PDL. For example, each of the first layer FL, the second layer SL, and the third layer TL may be applied only in the first opening OP1 of the pixel defining layer PDL by an inkjet printing method and thus positioned in the first opening OP1. In an embodiment, the inkjet printing method may be a method of applying each of the first layer FL, the second layer SL, and the third layer TL to a target area (e.g., in the first opening OP1 of the pixel defining layer PDL).

The second electrode UE may be disposed on the first to third emission layers EML1, EML2, and EML3, and the pixel defining layer PDL.

The second electrode UE may be a common layer formed in common to the first, second, and third sub-pixels SPX1, SPX2, and SPX3. The second electrode UE may be formed in the form of a plate in the overall area of the display area DA.

The second electrode UE (or the upper electrode) may be a thin-film metal layer having a thickness such that light emitted from each of the first, second, and third light emitting layers EML1, EML2, and EML3 may pass therethrough. The second electrode UE may be made of a metal material having a relatively small thickness, or a transparent conductive material. For example, the second electrode UE may be formed of various transparent conductive materials. The second electrode UE may include at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be substantially transparent (or translucent) to have a certain transmittance. Hence, light emitted from each of the first, second, and third emission layers EML1, EML2, and EML3 that are positioned under the second electrode UE may pass through the second electrode UE and be emitted in the upward direction of the thin-film encapsulation layer TFE.

The second electrode UE may contact the first, second, and third conductive pattern layers CP1, CP2, and CP3 in the non-emission areas NEA of the first, second, and third sub-pixels SPX1, SPX2, and SPX3 and thus be connected (e.g., electrically connected) to the first, second, and third conductive pattern layers CP1, CP2, and CP3. For example, in the non-emission area NEA of the first sub-pixel SPX1, the second electrode UE may contact the first conductive pattern layer CP1 and be connected (e.g., electrically connected) to the first conductive pattern layer CP1. Hence, the second electrode UE may be connected (e.g., electrically connected) to the driving voltage line DVL. In the non-emission area NEA of the second sub-pixel SPX2, the second electrode UE may contact the second conductive pattern layer CP2 and be connected (e.g., electrically connected) to the second conductive pattern layer CP2. Hence, the second electrode UE may be connected (e.g., electrically connected) to the driving voltage line DVL. In the non-emission area NEA of the third sub-pixel SPX3, the second electrode UE may contact the third conductive pattern layer CP3 and be connected (e.g., electrically connected) to the third conductive pattern layer CP3. Hence, the second electrode UE may be connected (e.g., electrically connected) to the driving voltage line DVL.

A thin-film encapsulation layer TFE may be provided and/or formed on the overall surface of the second electrode UE.

The thin-film encapsulation layer TFE has the same configuration as that of the thin-film encapsulation layer TFE described with reference to FIG. 3; therefore, redundant explanation thereof will be omitted for descriptive convenience.

The first, second, and third sub-pixels SPX1, SPX2, and SPX3 may be substantially similar or identical to each other in arrangement structure and connection relationship of the second electrode UE and the driving voltage line DVL. Hereinafter, the arrangement structure and the connection relationship of the second electrode UE and the driving voltage line DVL in the first sub-pixel SPX1 will be described as a representative example, and explanation of the second and third sub-pixels SPX2 and SPX3 will be omitted for descriptive convenience.

In the non-emission area NEA of the first sub-pixel SPX1, as illustrated in FIG. 8, the second electrode UE may be positioned over each of the pixel defining layer PDL and the first conductive pattern layer CP1 that is exposed through the second opening OP2 of the pixel defining layer PDL. Hence, the second electrode UE may be connected (e.g., electrically connected) to the first conductive pattern layer CP1, and may be connected (e.g., electrically connected) to the driving voltage line DVL of the pixel circuit layer PCL by the first conductive pattern layer CP1.

In the non-emission area NEA, the via layer VIA may include opposite side surfaces which face each other in the direction, e.g., in the second direction DR2, with the first via hole VIH1 interposed therebetween. For example, the via layer VIA may include the fifth edge ED5 (or the first side surface) and the sixth edge ED6 (or the second side surface) which face each other in the second direction DR2 with the first via hole VIH1 interposed therebetween. Each of the fifth edge ED5 and the sixth edge ED6 may be a side surface having a certain inclined angle in the via layer VIA.

In the non-emission area NEA, the pixel defining layer PDL may include opposite side surfaces which face each other in the second direction DR2, with the second opening OP2 interposed therebetween. For example, the pixel defining layer PDL may include the third edge ED3 (or the first side surface) and the fourth edge ED4 (or the second side surface) which face each other in the second direction DR2 with the second opening OP2 interposed therebetween. Each of the third edge ED3 and the fourth edge ED4 may be a side surface having a certain inclined angle in the pixel defining layer PDL positioned in the non-emission area NEA.

In each of the first, second, and third emission areas EMA1, EMA2, and EMA3, the pixel defining layer PDL may include opposite side surfaces which face each other in the second direction DR2 with the first opening OP1 interposed therebetween. For example, the pixel defining layer PDL may include, in each of the first, second, and third emission areas EMA1, EMA2, and EMA3, the first edge ED1 (or the first side surface) and the second edge ED2 (or the second side surface) which face each other in the second direction DR2 with the first opening OP1 interposed therebetween. Each of the first edge ED1 and the second edge ED2 may be a side surface having a certain inclined angle in the pixel defining layer PDL positioned in each of the first, second, and third emission areas EMA1, EMA2, and EMA3.

The first via hole VIH1 of the via layer VIA and the second opening OP2 of the pixel defining layer PDL may overlap (e.g., partially overlap) each other. The third edge ED3 of the pixel defining layer PDL may be positioned on a more outer side than (e.g., on the right side of) the fifth edge ED5, and may cover the via layer VIA including the fifth edge ED5. The third edge ED3 of the pixel defining layer PDL may be spaced apart from the fifth edge ED5 of the via layer VIA by a first distance d1. The fourth edge ED4 of the pixel defining layer PDL may be positioned on a more outer side than (e.g., on the right side of) the sixth edge ED6, and may expose an area of the via layer VIA including the sixth edge ED6. The fourth edge ED4 of the pixel defining layer PDL may be spaced apart from the sixth edge ED6 of the via layer VIA by a second distance d2. The fourth edge ED4 of the pixel defining layer PDL may be positioned on a planar upper surface of the via layer VIA.

The third edge ED3 of the pixel defining layer PDL may be spaced apart from the sixth edge ED6 of the via layer VIA by a fourth distance d4. The second opening OP2 of the pixel defining layer PDL and the first via hole VIH1 of the via layer VIA may overlap each other in an area between the third edge ED3 of the pixel defining layer PDL and the sixth edge ED6 of the via layer VIA.

The first via hole VIH1 of the via layer VIA and the first opening OP1 of the pixel defining layer PDL may be spaced apart from each other in the second direction DR2. The fifth edge ED5 of the via layer VIA may be positioned on a more outer side than (e.g., on the right side of) the second edge ED2 of the pixel defining layer PDL. The fifth edge ED5 of the via layer VIA may be spaced apart from the second edge ED2 of the pixel defining layer PDL by a third distance d3.

As described above, in the case where the via layer VIA which covers the eighth edge ED8 of the driving voltage line DVL and includes the first via hole VIH1 that exposes the seventh edge ED7 of the driving voltage line DVL is formed in the non-emission area NEA, and the pixel defining layer PDL is disposed on the via layer VIA and includes the third edge ED3 spaced apart from the fifth edge ED5 of the via layer VIA and the fourth edge ED4 spaced apart from the sixth edge ED6 of the via layer VIA, the first via hole VIH1 of the via layer and the second opening OP2 of the pixel defining layer PDL may overlap (e.g., partially overlap) each other. For example, the first central point CET1 which divides the first via hole VIH1 into two same portions and the second central point CET2 which divides the second opening OP2 into two same portions may be spaced apart from each other rather than coinciding. In the overlap area OVA where the first via hole VIH1 and the second opening OP2 overlap each other, the second electrode UE of the display element layer DPL may be connected (e.g., electrically connected) to the driving voltage line DVL of the pixel circuit layer PCL by the first conductive pattern layer CP1. In an embodiment, the overlap area OVA may be a connection point at which the second electrode UE and the driving voltage line DVL are connected (e.g., electrically connected) to each other.

In case that the first via hole VIH1 overlaps (e.g., partially overlaps) the second opening OP2, the pixel defining layer PDL having a stepped shape (or a smoothly stepped structure) may be positioned on a side (e.g., a left side) of the overlap area OVA, and only the via layer VIA may be positioned on another side (e.g., a right side) of the overlap area OVA. Hence, the second opening OP2 of the pixel defining layer PDL and the first via hole VIH1 of the via layer VIA which form a gentle inclination (or the pixel defining layer PDL and the via layer VIA which form a smooth profile) may be formed around the overlap area OVA. Hence, a step coverage in a subsequent process, which is performed after the pixel defining layer PDL has been formed, may be improved. For example, as the second electrode UE positioned on the pixel defining layer PDL has a smooth profile around the overlap area OVA, a line may be prevented from being reduced in thickness or cut off by a step difference of components (e.g., the pixel defining layer PDL and the via layer VIA) positioned around the overlap area OVA. Therefore, a disconnection defect of the second electrode UE may be prevented from occurring, so that the reliability of the pixel PXL and the display device DD including the pixel PXL may be enhanced.

As described above, in the non-emission area NEA of each of the first, second, and third sub-pixels SPX1, SPX2, and SPX3, the first via hole VIH1 of the via layer VIA and the second opening OP2 of the pixel defining layer PDL may overlap (e.g., partially overlap) each other, so that the surface area (or the size) of each of the first, second, and third emission areas EMA1, EMA2, and EMA3 may be further increased, compared to the case where the first via hole VIH1 and the second opening OP2 are completely spaced apart from each other. Therefore, a supply surface area (or a distribution surface area) of the first emission layer EML1, in which the first emission layer EML1 is deposited by an inkjet printing method or the like, a supply surface area (or a distribution surface area) of the second emission layer EML2, in which the second emission layer EML2 is deposited, and a supply surface area (or a distribution surface area) of the third emission layer EML3, in which the third emission layer EML3 is deposited, may be increased, so that the light output efficiency of the corresponding sub-pixel SPX may be further enhanced.

Figure 10:
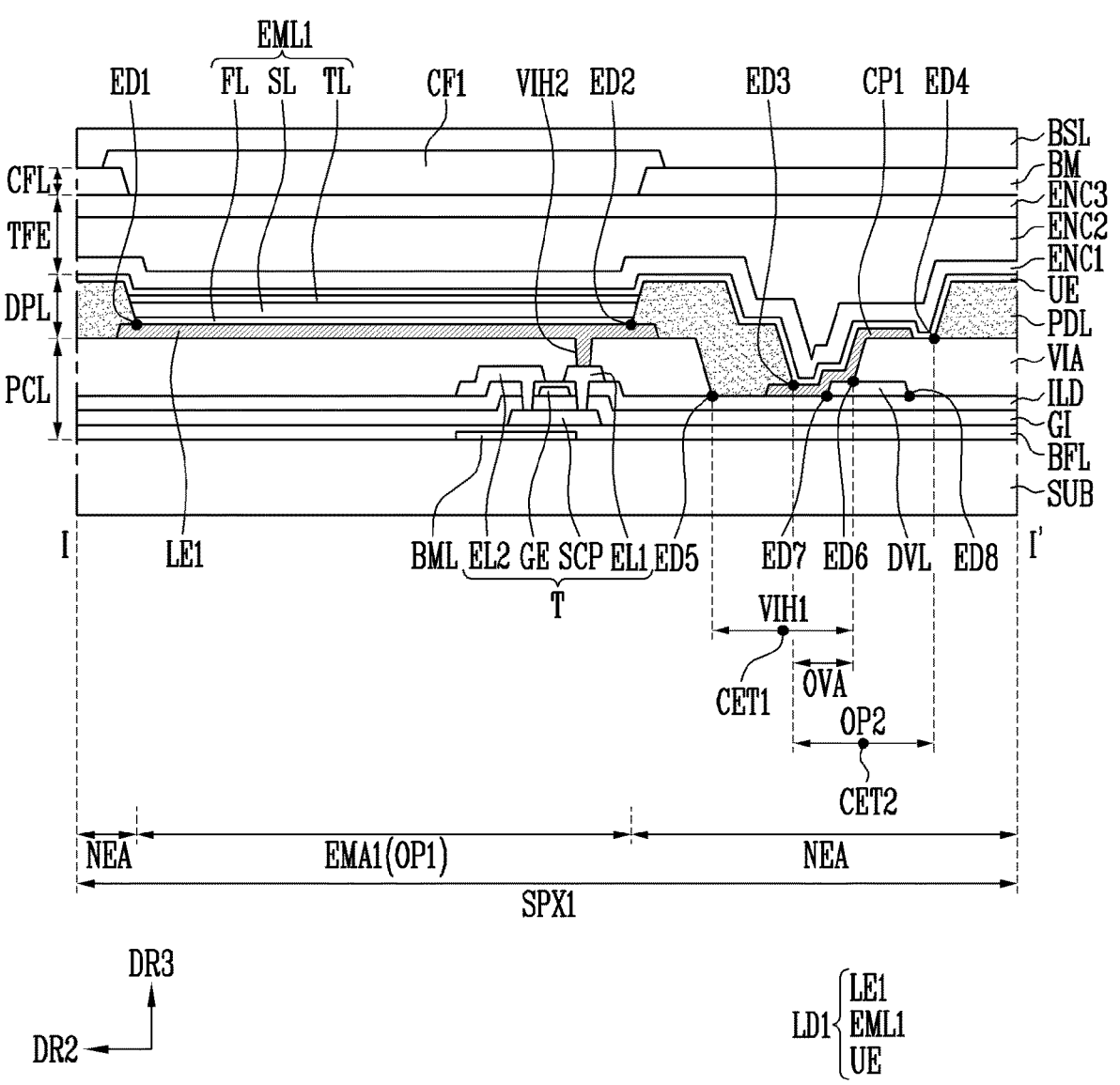
FIG. 10 schematically illustrates a pixel in accordance with an embodiment, and is a schematic cross-sectional view corresponding to line I-I' of FIG. 5.

For example, the first emission layer EML1 may be formed only in the first emission area EMA1 by an inkjet printing method, the second emission layer EML2 may be formed only in the second emission area EMA2, and the third emission layer EML3 may be formed only in the third emission area EMA3. In the overlap area OVA where the second opening OP2 of the pixel defining layer PDL and the first via hole VIH1 of the via layer VIA overlap each other, the second electrode UE of the display element layer DPL may be connected (e.g., electrically connected) to the driving voltage line DVL of the pixel circuit layer PCL. Therefore, a laser drilling process which is used in an existing pixel structure in which an emission layer is formed by full-surface deposition and formed in common to adjacent pixels, for example, a separate process for electrically connecting the upper electrode positioned on the emission layer to the driving voltage line, may be omitted, so that the production efficiency may be increased. FIG. 10 schematically illustrates a pixel PXL in accordance with an embodiment, and is a schematic cross-sectional view corresponding to line I-I' of FIG. 5.

With regard to the embodiment of FIG. 10, the following description will describe differences from that of the foregoing embodiments, to avoid redundant explanation.

Referring to FIGS. 1 to 6, and 10, the first sub-pixel SPX1 may include a substrate SUB, a pixel circuit layer PCL, a display element layer DPL, a thin-film encapsulation layer TFE, and a color filter layer CFL.

The color filter layer CFL may be formed over the thin-film encapsulation layer TFE through a subsequent process. The color filter layer CFL may include a first color filter CF1 and a light blocking pattern layer BM.

The first color filter CF1 may correspond to (or overlap) the first emission area EMA1 and be positioned on a surface of the third encapsulation layer ENC3 of the thin-film encapsulation layer TFE. The first color filter CF1 may be disposed over the corresponding first emission layer EML1 in the first emission area EMA1 enclosed (or surrounded) by the pixel defining layer PDL. The first color filter CF1 may be a red color filter.

The light blocking pattern layer BM may be positioned adjacent to the first color filter CF1 on the surface of the third encapsulation layer ENC3 of the thin-film encapsulation layer TFE. The light blocking pattern layer BM may be a black matrix.

For example, the color filter layer CFL may be formed in the second and third sub-pixels SPX2 and SPX3 that are adjacent to the first sub-pixel SPX1. For example, the color filter layer CFL in the second sub-pixel SPX2 may include a second color filter (refer to "CF2" of FIG. 3) and a light blocking pattern layer BM positioned adjacent to the second color filter CF2. The color filter layer CFL in the third sub-pixel SPX3 may include a third color filter (refer to "CF3" of FIG. 3) and a light blocking pattern layer BM positioned adjacent to the third color filter CF3. The second color filter CF2 may include a green color filter. The third color filter CF3 may include a blue color filter.

The base layer BSL may be provided and/or formed on the overall surface of the color filter layer CFL.

In the first sub-pixel SPX1 in accordance with the foregoing embodiment, the color filter layer CFL may be disposed on the first light emitting element LD1 through a subsequent process so that light emitted through the color filter layer CFL may have excellent color reproducibility, whereby the light output efficiency may be enhanced.

Figure 11:
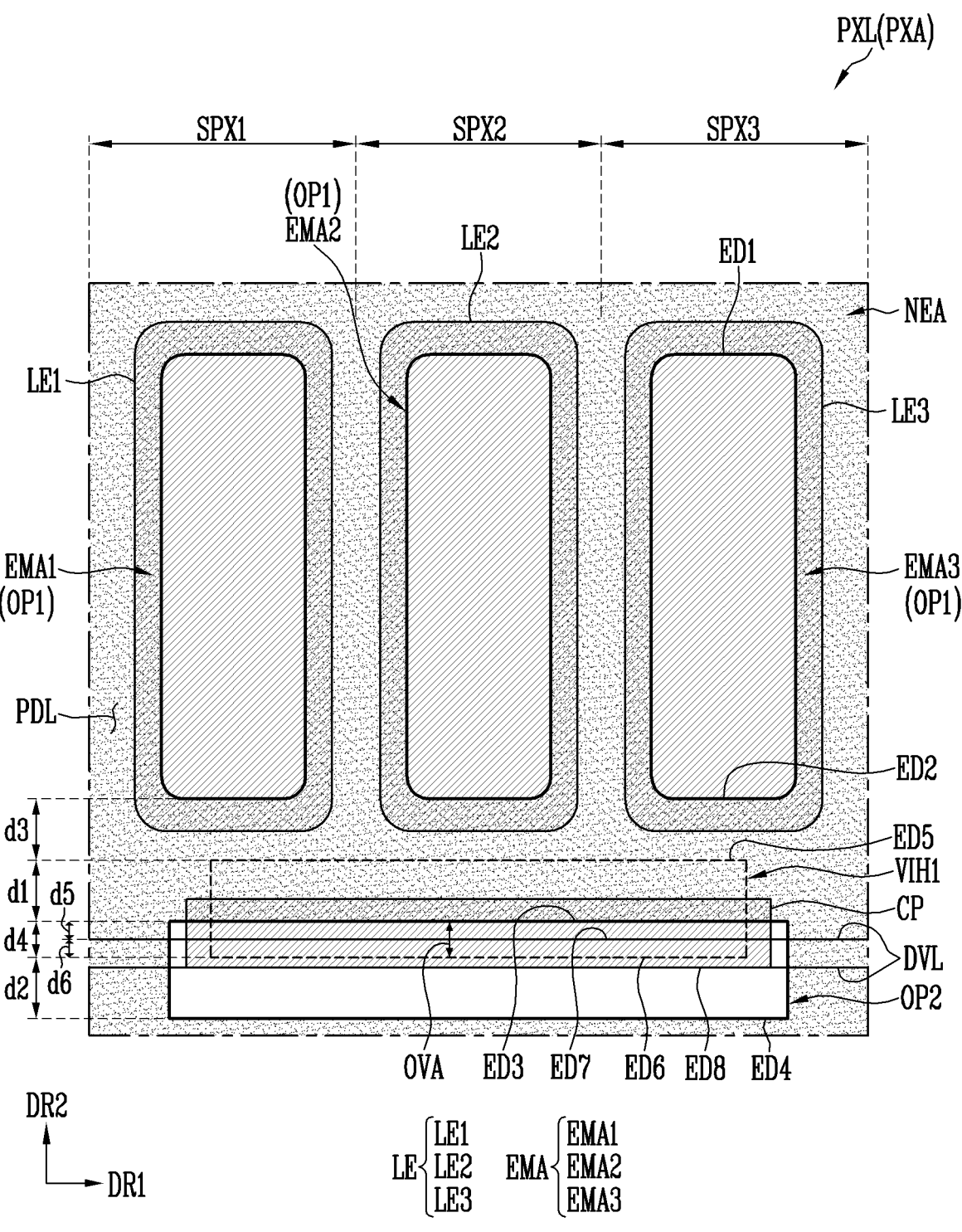
FIG. 11 is a schematic plan view illustrating a pixel in accordance with an embodiment.

FIG. 11 is a schematic plan view illustrating a pixel PXL in accordance with an embodiment.

With regard to the embodiment of FIG. 11, the following description will describe differences from that of the foregoing embodiments, to avoid redundant explanation.

Referring to FIGS. 1 to 4, and 11, the pixel PXL may be disposed in the pixel area PXA. The pixel PXL may include a first sub-pixel SPX1, a second sub-pixel SPX2, and a third sub-pixel SPX3.

The first sub-pixel SPX1 may include a first emission area EMA1 and a non-emission area NEA. The second sub-pixel SPX2 may include a second emission area EMA2 and a non-emission area NEA. The third sub-pixel SPX3 may include a third emission area EMA3 and a non-emission area NEA.

The first-first electrode LE1 may be positioned in at least the first emission area EMA1. The first-second electrode LE2 may be positioned in at least the second emission area EMA2. The first-third electrode LE3 may be positioned in at least the third emission area EMA3.

The pixel PXL may include a pixel defining layer PDL which encloses (or surrounds) the first, second, and third emission areas EMA1, EMA2, and EMA3.

The pixel defining layer PDL may include a first opening OP1 which encloses (or surrounds) each of the first, second, and third emission areas EMA1, EMA2, and EMA3, and a second opening OP2 which is spaced apart from the first opening OP1 and positioned in the non-emission area NEA. In each of the first, second, and third sub-pixels SPX1, SPX2, and SPX3, the pixel defining layer PDL may include a first edge ED1 (e.g., a first side surface) and a second edge ED2 (e.g., a second side surface) which face each other in the second direction DR2 with the first opening OP1 interposed therebetween. Furthermore, the pixel defining layer PDL may include, in the non-emission area NEA, a third edge ED3 (e.g., a first side surface) and a fourth edge ED4 (e.g., a second side surface) which face each other in the second direction DR2 with the second opening OP2 interposed therebetween.

In an embodiment, the second opening OP2 may be formed, in the first direction DR1, over the non-emission area NEA of the first sub-pixel SPX1, the non-emission area NEA of the second sub-pixel SPX2, and the non-emission area NEA of the third sub-pixel SPX3. For example, the second opening OP2 may extend from the non-emission area NEA of the first sub-pixel SPX1 to the non-emission area NEA of the second sub-pixel SPX2 and the non-emission area NEA of the third sub-pixel SPX3 in the first direction DR1.

A driving voltage line DVL, a first via hole VIH1 of a via layer (refer to "VIA" of FIG. 7), and a conductive pattern layer CP may be positioned in the non-emission areas NEA of the first, second, and third sub-pixels SPX1, SPX2, and SPX3.

The driving voltage line DVL may be a component formed in common in the first, second, and third sub-pixels SPX1, SPX2, and SPX3. The voltage of the first driving power supply ELVDD or the voltage of the second driving power supply ELVSS may be applied to the driving voltage line DVL. In an embodiment, the driving voltage line DVL may include a seventh edge ED7 (e.g., a first side surface) and an eighth edge ED8 (e.g., a second side surface) which face each other in the second direction DR2. The seventh edge ED7 of the driving voltage line DVL may be positioned adjacent to the third edge ED3 of the pixel defining layer PDL in a plan view. The eighth edge ED8 of the of the driving voltage line DVL may be positioned adjacent to the sixth edge ED6 of the via layer VIA in a plan view.

In an embodiment, the seventh edge ED7 of the driving voltage line DVL may be exposed through the first via hole VIH1. The eighth edge ED8 of the driving voltage line DVL may be covered by the via layer VIA rather than being exposed.

The first via hole VIH1 may be a through hole passing through the via layer VIA, and may expose, e.g., the seventh edge ED7 of the driving voltage line DVL that is a component positioned under the via layer VIA, without exposing the eighth edge ED8 of the driving voltage line DVL. The first via hole VIH1 may be formed, in the first direction DR1, over the non-emission area NEA of the first sub-pixel SPX1, the non-emission area NEA of the second sub-pixel SPX2, and the non-emission area NEA of the third sub-pixel SPX3. For example, the first via hole VIH1 may extend from the non-emission area NEA of the first sub-pixel SPX1 to the non-emission area NEA of the second sub-pixel SPX2 and the non-emission area NEA of the third sub-pixel SPX3 in the first direction DR1. The via layer VIA may include a fifth edge ED5 (or a first side surface) and a sixth edge ED6 (or a second side surface) which face each other in the second direction DR2 with the first via hole VIH1 interposed therebetween.

The conductive pattern layer CP may be positioned on the driving voltage line DVL that is exposed through the first via hole VIH1, and may contact the driving voltage line DVL and be connected (e.g., electrically connected) to the driving voltage line DVL. In an embodiment, the conductive pattern layer CP may be formed, in the first direction DR1, over the non-emission area NEA of the first sub-pixel SPX1, the non-emission area NEA of the second sub-pixel SPX2, and the non-emission area NEA of the third sub-pixel SPX3. The conductive pattern layer CP may be a protective component which prevents the exposed driving voltage line DVL from being damaged by etchant used during a process of forming the first-first, first-second, and first-third electrodes LE1, LE2, and LE3.

The conductive pattern layer CP may be exposed to the outside in the overlap area OVA where the first via hole VIH1 and the second opening OP2 overlap each other. As each of the first via hole VIH1, the second opening OP2, and the conductive pattern layer CP may be formed over the non-emission area NEA of the first sub-pixel SPX1, the non-emission area NEA of the second sub-pixel SPX2, and the non-emission area NEA of the third sub-pixel SPX3, the surface area (or the size) of a portion of the conductive pattern layer CP that is exposed through the overlap area OVA may be increased.

In an embodiment, the first opening OP1 of the pixel defining layer PDL, the first via hole VIH1 of the via layer VIA, and the second opening OP2 of the pixel defining layer PDL may be disposed (e.g., sequentially arranged) in the direction, e.g., in the second direction DR2. The first opening OP1 and the first via hole VIH1 may be spaced apart from each other. The first via hole VIH1 and the second opening OP2 may overlap (e.g., partially overlap) each other.

The second edge ED2 of the pixel defining layer PDL and the fifth edge ED5 of the via layer VIA may be spaced apart from each other by a third distance d3 in the second direction DR2. The fifth edge ED5 and the third edge ED3 of the pixel defining layer PDL may be spaced apart from each other by a first distance d1 in the second direction DR2. The third edge ED3 and the sixth edge ED6 of the via layer VIA may be spaced apart from each other by a fourth distance d4 in the second direction DR2. The sixth edge ED6 and the fourth edge ED4 of the pixel defining layer PDL may be spaced apart from each other by a second distance d2 in the second direction DR2.

In the overlap area OVA where the second opening OP2 and the first via hole VIH1 are overlapped with each other, the third edge ED3 of the pixel defining layer PDL and the seventh edge ED7 of the driving voltage line DVL may be spaced apart from each other by a fifth distance d5, and the seventh edge ED7 of the driving voltage line DVL and the sixth edge ED6 of the via layer VIA may be spaced apart from each other by a sixth distance d6.

In the overlap area OVA where the second opening OP2 and the first via hole VIH1 overlap each other, the conductive pattern layer CP may be exposed to the outside, and may contact the second electrode (refer to "UE" of FIG. 7) positioned over the pixel defining layer PDL and be connected (e.g., electrically connected) to the second electrode UE.

The second electrode UE may be made of transparent conductive material having a relatively small thickness, and may have high resistance. The surface area (or the size) of the portion of the conductive pattern layer CP that is exposed to the outside in the overlap area OVA, in which the second opening OP2 and the first via hole VIH1 overlap each other, may be increased, line resistance of the second electrode UE that is connected (e.g., electrically connected) to the conductive pattern layer CP to form a double-layer structure may be reduced.

Furthermore, as the second electrode UE is connected (e.g., electrically connected) to the driving voltage line DVL by the conductive pattern layer CP, the resistance of the second electrode UE may be reduced. Therefore, electrical contact characteristics between the second electrode UE and the driving voltage line DVL may be enhanced.

In a display device in accordance with an embodiment, a via hole of a via layer and an opening of a pixel defining layer may overlap (e.g., partially overlap) each other in a non-emission area. Hence, in a contactor which connects (e.g., electrically connects) an electrode pattern layer positioned over the pixel defining layer to a driving voltage line positioned under the via layer, the via layer and the pixel defining layer may form a smooth profile (or the via hole and the opening form a gentle inclination), so that influence of the profile of the via layer and the pixel defining layer on the electrode pattern layer in the contactor may be minimized, whereby the electrode pattern may be prevented from being disconnected.

For example, the display device in accordance with an embodiment may have improved reliability.

Furthermore, in the display device in accordance with an embodiment, the surface area of an emission area of each pixel may be further increased, so that light output efficiency of the display device may be enhanced.

The effects of the disclosure are not limited by the foregoing, and other various effects are anticipated herein.

While various exemplary embodiments have been described above, those skilled in the art will appreciate that various modifications, additions and substitutions are possible, without departing from the scope of the disclosure.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
    a plurality of pixels including an emission area and a non-emission area, wherein each pixel comprises:
    a driving voltage line disposed on a substrate;
    a via layer disposed on the driving voltage line, the via layer including:
        a first via hole exposing a first driving voltage line edge of the driving voltage line, and
        a second via hole spaced apart from the first via hole;
    a first electrode disposed on the via layer;
    a pixel defining layer disposed on the first electrode and the via layer, the pixel defining layer including:
        a first opening disposed in the emission area and exposing a portion of the first electrode, and
        a second opening spaced apart from the first opening and disposed in the non-emission area;
    an emission layer disposed in the first opening of the pixel defining layer; and
    a second electrode disposed on the emission layer and the pixel defining layer,
    the second opening of the pixel defining layer and the first via hole of the via layer partially overlap each other in the non-emission area, and
    the via layer covers a second driving voltage line edge of the driving voltage line, the second driving voltage line edge being opposite the first driving voltage line edge.

2. The display device according to claim 1, wherein a first central point that divides the first via hole of the via layer into two portions is spaced apart from a second central point that divides the second opening of the pixel defining layer into two portions in a direction.

3. The display device according to claim 2, wherein
    the first opening of the pixel defining layer, the first via hole of the via layer, and the second opening of the pixel defining layer are sequentially disposed in the direction,
    the pixel defining layer includes a first edge and a second edge that face each other in the direction and define the first opening between the first edge and the second edge, and a third edge and a fourth edge that face each other in the direction and define the second opening between the third edge and the fourth edge, and the via layer includes a fifth edge and a sixth edge that face each other in the direction and define the first via hole of the via layer between the fifth edge and the sixth edge.

4. The display device according to claim 3, wherein the first edge of the pixel defining layer, the second edge of the pixel defining layer, the third edge of the pixel defining layer, the fourth edge of the pixel defining layer, the fifth edge of the via layer, and the sixth edge of the via layer are spaced apart from each other.

5. The display device according to claim 4, wherein the first edge of the pixel defining layer, the second edge of the pixel defining layer, the fifth edge of the via layer, the third edge of the pixel defining layer, the sixth edge of the via layer, and the fourth edge of the pixel defining layer are sequentially disposed in the direction in a plan view.

6. The display device according to claim 5, wherein
    the fifth edge of the via layer and the third edge of the pixel defining layer are spaced apart from each other by a first distance in the direction in a plan view,
    the sixth edge of the via layer and the fourth edge of the pixel defining layer are spaced apart from each other by a second distance in the direction in a plan view, and
    the first distance and the second distance are substantially identical to each other.

7. The display device according to claim 6, wherein
    the second edge of the pixel defining layer and the fifth edge of the via layer are spaced apart from each other by a third distance in the direction in a plan view, and
    the third distance is substantially identical to each of the first distance and the second distance.

8. The display device according to claim 7, wherein
    the third edge of the pixel defining layer and the sixth edge of the via layer are spaced apart from each other by a fourth distance in the direction in a plan view, and
    the fourth distance is different from each of the first distance, the second distance, and the third distance.

9. The display device according to claim 5, wherein
    each pixel further comprises a conductive pattern layer disposed in the first via hole of the via layer and the second opening of the pixel defining layer in the non-emission area, and
    the conductive pattern layer is disposed on the first side of the driving voltage line and contacts the driving voltage line.

10. The display device according to claim 9, wherein the conductive pattern layer and the first electrode include a same material.

11. The display device according to claim 10, wherein
    the second electrode contacts the conductive pattern layer in an overlap area where the first via hole of the via layer and the second opening of the pixel defining layer overlap each other, and
    the second electrode is electrically connected to the driving voltage line through the conductive pattern layer.

12. The display device according to claim 1, wherein the emission layer comprises:
    a first layer disposed on the first electrode in the first opening;
    a second layer disposed on the first layer; and
    a third layer disposed between the second layer and the second electrode, and
    the first layer, the second layer, and the third layer are disposed in the first opening.

13. The display device according to claim 12, wherein each of the first layer, the second layer, and the third layer is formed in the first opening by an inkjet printing operation.

14. The display device according to claim 13, wherein the first electrode includes an anode, the first layer includes a hole transport layer, the second layer includes a light generation layer, the third layer includes an electron transport layer, and the second electrode includes a cathode.

15. The display device according to claim 13, wherein the first electrode includes a cathode, the first layer includes an electron transport layer, the second layer includes a light generation layer, the third layer includes a hole transport layer, and the second electrode includes an anode.

16. The display device according to claim 1, wherein each pixel further comprises a thin-film encapsulation layer disposed on the second electrode, the thin-film encapsulation layer comprises:

a first encapsulation layer disposed on the second electrode, a second encapsulation layer disposed on the first encapsulation layer, and a third encapsulation layer disposed on the second encapsulation layer, each of the first encapsulation layer and the third encapsulation layer comprises an inorganic layer, and the second encapsulation layer comprises an organic layer.

17. The display device according to claim 16, wherein each pixel further comprises a color filter layer disposed on the thin-film encapsulation layer, the color filter layer comprises:

a color filter disposed over the emission layer; and a light blocking pattern layer disposed adjacent to the color filter and disposed in the non-emission area.

18. The display device according to claim 1, wherein the first via hole of the via layer and the second opening of the pixel defining layer extend to the non-emission areas of adjacent pixels.

19. The display device according to claim 18, wherein each pixel further comprises a conductive pattern layer disposed in the first via hole of the via layer and the second opening of the pixel defining layer, the conductive pattern layer is disposed on the first side of the driving voltage line and contacts the driving voltage line, and the conductive pattern layer extends to the non-emission areas of the adjacent pixels.

20. An electronic device comprising:

a substrate including an emission area and a non-emission area;

a driving voltage line disposed in the non-emission area;

a via layer disposed on the driving voltage line, the via layer including:

a first via hole exposing a first driving voltage line edge side of the driving voltage line, and a second via hole spaced apart from the first via hole;

a first-first electrode, a first-second electrode, and a first-third electrode disposed on the via layer in the emission area and spaced apart from each other;

a pixel defining layer disposed on the first-first electrode, the first-second electrode, and the first-third electrode and the via layer, the pixel defining layer including:

a first opening disposed in the emission area and exposing a portion of each of the first-first electrode, the first-second electrode, and the first-third electrode, and a second opening spaced apart from the first opening and disposed in the non-emission area;

a first emission layer disposed on the first-first electrode;

a second emission layer disposed on the first-second electrode;

a third emission layer disposed on the first-third electrode; and a second electrode disposed on the first emission layer, the second emission layer, and the third emission layer and the pixel defining layer, wherein the first emission layer, the second emission layer, and the third emission layer emit different colors of light, the second opening of the pixel defining layer and the first via hole of the via layer partially overlap each other in the non-emission area, and the via layer covers a second driving voltage line edge of the driving voltage line, the second driving voltage line edge being opposite the first driving voltage line edge.

21. The electronic device according to claim 20, wherein a first central point that divides the first via hole into two portions is spaced apart from a second central point that divides the second opening into two portions in a direction.

* * * * *